United States Patent
Kawai

(10) Patent No.: US 7,432,635 B2
(45) Date of Patent: Oct. 7, 2008

(54) MOVING MEMBER DRIVING DEVICE AND LENS BARREL

(75) Inventor: Sumio Kawai, Tokyo (JP)

(73) Assignees: Olympus Corporation, Tokyo (JP); Olympus Imaging Corp., Tokyo (JP)

( * ) Notice: Subject to any disclaimer, the term of this patent is extended or adjusted under 35 U.S.C. 154(b) by 412 days.

(21) Appl. No.: 11/093,796

(22) Filed: Mar. 30, 2005

(65) Prior Publication Data
US 2005/0219719 A1    Oct. 6, 2005

(30) Foreign Application Priority Data
Apr. 2, 2004  (JP) ............................. 2004-110482
Feb. 7, 2005  (JP) ............................. 2005-030978

(51) Int. Cl.
*H02N 2/00*  (2006.01)

(52) U.S. Cl. .................. 310/323.17; 359/824; 310/317

(58) Field of Classification Search ........... 310/323.17, 310/328, 317; 359/824
See application file for complete search history.

(56) References Cited

U.S. PATENT DOCUMENTS

| 3,259,044 A | * | 7/1966 | MacMillin et al. ............ 396/72 |
| 4,560,263 A | * | 12/1985 | Katsuma et al. ............. 396/133 |
| 4,660,933 A | * | 4/1987 | Notagashira et al. ........ 359/824 |
| 5,751,502 A | * | 5/1998 | Watanabe .................... 359/823 |

FOREIGN PATENT DOCUMENTS

| JP | 59-101608 | * | 6/1984 | |
| JP | 59-111624 | * | 7/1984 | |
| JP | 59-197026 | * | 11/1984 | ............... 396/133 |
| JP | 61-086718 |   | 5/1986 | |
| JP | 02-253216 |   | 10/1990 | |
| JP | 08-286090 |   | 11/1996 | |
| JP | 08-334669 |   | 12/1996 | |
| JP | 10-148752 |   | 6/1998 | |
| JP | 10-186206 |   | 7/1998 | |

* cited by examiner

*Primary Examiner*—Thomas M Dougherty
(74) *Attorney, Agent, or Firm*—Volpe and Koenig, P.C.

(57) ABSTRACT

A driving device in a lens barrel unit of a lens unit drives advancing/retreating of a lens frame holding a lens, and manual focusing. The lens frame is supported freely movably back and forth by an internal driving ring turned and driven when automatic focusing. The internal driving ring is supported by a distance ring so as to be turned and driven via an external driving ring supported turnably by a fixing frame. An operating ring is fixed on the perimeter of the distance ring, and manual focusing driving is performed by turning the operating ring. A transducer of an ultrasonic actuator is pressed against the end face of the distance ring via a driver, frictional contact force between the distance ring and the driver is adjusted by applying flexion standing wave vibration to the transducer, and the amount of turning operating force of the operating ring can be increased/decreased over a wide range.

17 Claims, 14 Drawing Sheets

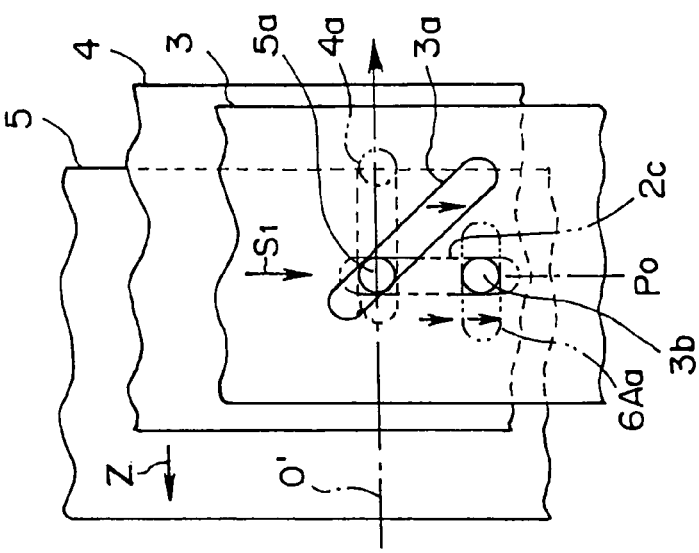
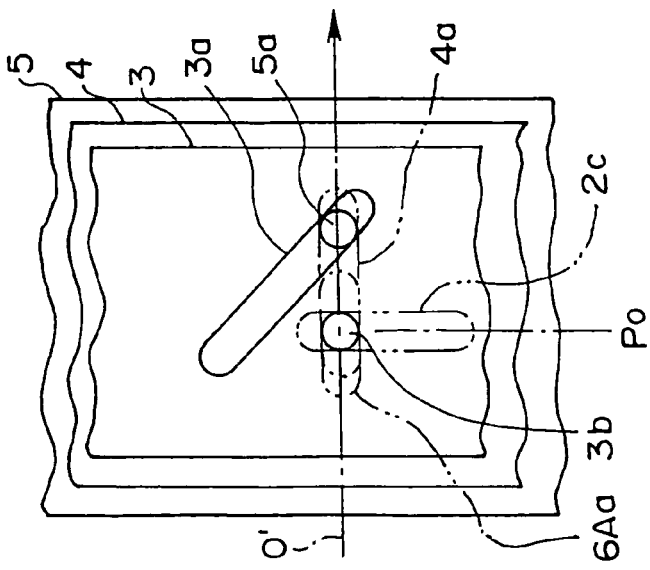

MOVING MEMBER DRIVING DEVICE AND LENS BARREL

This application claims benefit of Japanese Applications No. 2004-110482 filed in Japan on Apr. 2, 2004 and No. 2005-30978 filed in Japan on Feb. 7, 2005 the contents of which are incorporated by this reference.

BACKGROUND OF THE INVENTION

1. Field of the Invention

The present invention relates to a driving device for moving a moving member using an operating member, and a lens barrel for moving a moving member using an operating member.

2. Description of the Related Art

Conventional examples of a camera lens manual operating device include a focusing operating device disclosed in Japanese Unexamined Patent Application Publication No. 8-334669, and a zoom device disclosed in Japanese Unexamined Patent Application Publication No. 8-286090. Manual operations in these devices are linked with a lens frame and an operating member both serving as operating targets, and the amount of operating force of the operating member depends on a driving mechanism. Applying load of a predetermined amount of operating force to the operating member provides a user with the sensation of operation.

Also, Japanese Unexamined Patent Application Publication No. 10-148752 discloses a mechanism wherein the stop position of a focus lens is set beforehand, and the focus lens is stopped at the position.

Further, Japanese Unexamined Patent Application Publication No. 59-101608 discloses a method wherein when a photographing lens is switched to manual focus or auto focus using an ultrasonic motor, and manual driving is employed, friction resistance is reduced at the time of driving by generating a standing wave at a transducer of the ultrasonic motor.

Similarly, Japanese Unexamined Patent Application Publication No. 6-64224 discloses a mechanical mechanism relating to switching a photographing lens to manual focus or auto focus using an ultrasonic motor.

On the other hand, examples of an AF/MF switchable lens driving device include devices disclosed in Japanese Unexamined Patent Application Publication No. 2-253216 and No. 10-186206 wherein a power conveying member for conveying the driving force of a vibrating motor, an operating force conveying member for conveying the driving force of manual operations, and a planetary mechanism serving as a mechanism for interlocking these conveying members are employed.

SUMMARY OF THE INVENTION

A driving device or a lens barrel according to the present invention have features wherein the amount of operating force of a moving member may be set in a wide range including the light side, and further, an operating member may be fixed and held at a predetermined position.

According to one aspect of the present invention, a moving member driving device, which has an ultrasonic actuator, for controlling movement of a moving member, comprises: a manual operating member for moving the moving member according to manual operations; a vibrator, which is a member comprising the ultrasonic actuator, pressured so as to add frictional contact force to the manual operating member; and amount-of-operating-force adjusting control means for arbitrarily adjusting the amount of manual operating force at the time of performing manual operations of the manual operating member by controlling a state of vibration generated by the vibrator so as to change the frictional contact force.

According to another aspect of the present invention, a moving member driving device, which has an ultrasonic actuator, for controlling movement of a moving member, comprises: a manual operating member manually operated to move the moving member; a vibrator, which is a member comprising the ultrasonic actuator, brought into pressurizing contact with the manual operating member so as to add frictional contact force to the manual operating member; vibrator control means for driving and controlling the vibrator so as to change the frictional contact force relating to the amount of manual operating force at the time of performing manual operations of the manual operating member; and an amount-of-operating-force switching-and-setting means for setting driving control of the vibrator with the vibrator control means to switch and set the amount of operating force of the manual operating member.

According to a third aspect of the present invention, an optical member driving device, which has an ultrasonic actuator, for controlling movement of an optical member, comprises: an operating member, which can be manually operated, so as to interlock and move the optical member; a vibrator, which is a member comprising the ultrasonic actuator, for generating ultrasonic vibration; pressurizing means for pressurizing the vibrator so that the vibrator is brought into frictional contact with the operating member; vibrator control means for performing driving control of the vibrator to change the vibration state of the vibrator so as to arbitrarily change frictional contact force, which brings the vibrator into frictional contact with the operating member, relating to the amount of manual operating force at the time of manually operating the operating member.

According to a fourth aspect of the present invention, a moving member driving device, which has at least part of an optical member of an optical system for forming an optical image of a subject, for controlling movement of a moving member so as to be moved in the optical axial direction, comprises: an operating member operated manually; a driving mechanism for moving the moving member according to operations of the operating member; amount-of-operating-force setting means for outputting an signal according to setting operations so as to arbitrarily set the amount of operating force of the operating member; and amount-of-force adjusting control means for controlling the amount of operating force of the operating member according to a setting signal from the amount-of-operating-force setting means.

According to a fifth aspect of the present invention, a moving member driving device, which has at least part of an optical member of a photographing optical system for forming an optical image of a subject, for controlling movement of a moving member so as to be moved in the optical axial direction, comprises: an operating member operated manually for driving the moving member according to manual operations; focusing-start-signal output means for outputting a signal for electrically driving the moving member based on focusing information as to the subject; a first driving mechanism for interlocking and moving the moving member according to operations of the operating member; a second driving mechanism including a driving member for electrically driving the moving member in response to a signal from the focusing-start-signal output means; a first amount-of-force switching means for electrically switching the operating member to a fixed state or an unfixed state; a second amount-of-force switching means for electrically switching a driving member comprising the second driving mechanism to a fixed state or an unfixed state; amount-of-operating-force setting means for outputting a signal corresponding to setting operations so as to arbitrarily set the amount of operating force of the operating member in the unfixed state; and amount-of-force adjusting control means for electrically controlling the amount of operating force of the operating member based on a setting signal from the amount-of-operating-force setting means at the time of manually operating the operating member.

According to a sixth aspect of the present invention, a moving member driving device, for controlling movement of a moving member comprises: a manual operating member for moving the moving member via a first connecting mechanism in conjunction with manual operations; a first ultrasonic actuator including a vibrator pressurized in the proximal direction with the manual operating member or the first connecting mechanism so as to add frictional contact force to the manual operating member; a second ultrasonic actuator for electrically driving the moving member not via the first connecting mechanism but via the second connecting mechanism; first switching control means for selectively switching the manual operating member to an inoperable fixed state or an operable unfixed state by controlling a vibration state generated by the vibrator of the first ultrasonic actuator; second switching control means for selectively switching the second connecting mechanism to a fixed state or an unfixed state in which the moving member is driven via the second connecting mechanism by performing driving control of the second ultrasonic actuator; and control means for switching manual driving of the moving member due to operations of the manual operating member or electric driving of the moving member with the second ultrasonic actuator by controlling the first switching control means and the second switching control means.

According to a seventh aspect of the present invention, a lens barrel comprises: a photographing optical system for forming an optical image of a subject; a fixing member holding at least part of an optical member of the photographing optical system so as to be moved; an operating member, which is held in the fixing member so as to be relatively moved, manually operated; a first driving conveying mechanism for conveying the part of the optical member according to operations of the operating member; an actuator activated by an electrical signal to move an electric moving member, and holding the electric moving member so as not to be moved when non-active; and a second driving conveying mechanism for conveying the part of the optical member by operation of the electric moving member.

According to an eighth aspect of the present invention, a lens barrel comprises: a fixing frame; a manually operable operating member fitted in the fixing frame so as to rotate; a driving member, which is fitted in the fixing frame so as to rotate, to which rotational operation of the operating member is conveyed; an electric moving member rotated and driven by an actuator operated by an electrical signal; and a lens frame having an engaging portion for engaging with the driving member and the electric moving member and holding an optical member; wherein when the driving member or the electric moving member rotates, the lens frame moves in the optical axial direction.

According to the other aspect of the present invention, a lens barrel, of which a lens frame holding at least part of a moving optical system of a photographing optical system can be moved by an electrical driving source, and also the lens frame holding the moving optical system can be moved by a manual operating member, comprises: an electric driving ring rotated and driven by driving the electrical driving source, restricted so as to be incapable of rotation by stopping driving of the electrical driving source, and engaging the lens frame for guiding therewith so as to be moved in the optical axial direction; a manual driving ring rotated and driven by operating the manual operating member, restricted so as to be incapable of rotation by stopping operations of the manual operating member, and engaging the lens frame for guiding therewith so as to be moved in the optical axial direction; electric lens moving means for moving the lens frame while engaging the lens frame for guiding with the manual driving ring by making the manual driving ring to an operating-shutoff state, and also rotating and driving the electric driving ring by driving the electrical driving source; and manual lens moving means for moving the lens frame while engaging the lens frame for guiding with the electric driving ring by making the electric driving ring to an driving-shutoff state, and also rotating and driving the manual driving ring by operating the manual operating member.

Other features and advantages of the present invention will be apparent with reference to the following description.

BRIEF DESCRIPTION OF THE DRAWINGS

FIG. 19A is a partial development illustrating the principal components (guide groove, driving/driven pins, and so forth) of the lens barrel driving portion in FIG. 18 as viewed from the perimeter side, which shows the initial state of focusing driving;

FIG. 19B is similarly a partial development illustrating the principal components (guide groove, driving/driven pins, and so forth) of the lens barrel driving portion in FIG. 18 as viewed from the perimeter side, which shows a manual focusing driving state;

FIG. 19C is similarly a partial development illustrating the principal components (guide groove, driving/driven pins, and so forth) of the lens barrel driving portion in FIG. 18 as viewed from the perimeter side, which shows an electric focusing driving state;

DESCRIPTION OF THE PREFERRED EMBODIMENTS

Description will be made below regarding embodiments of the present invention.

Figure 1:
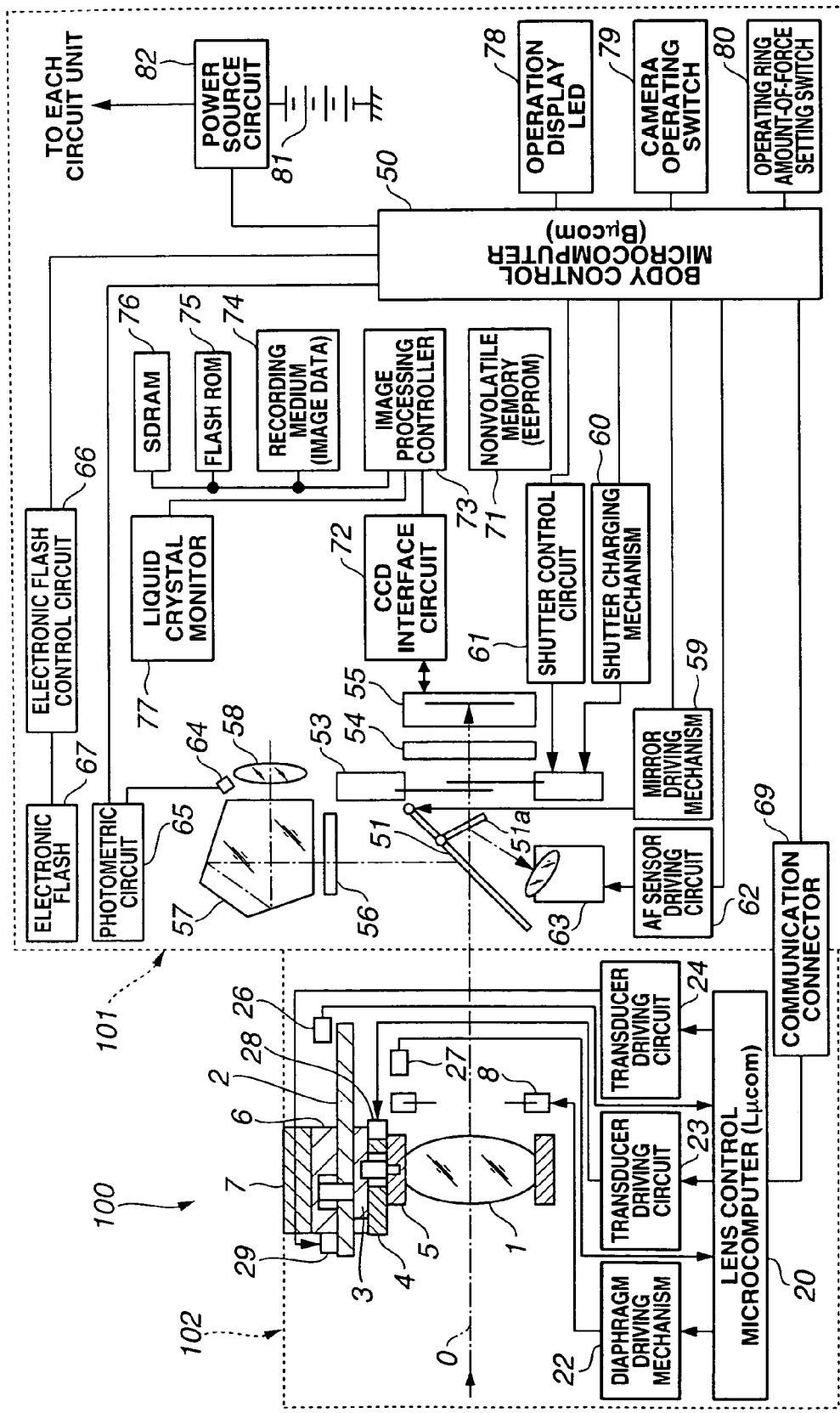
FIG. 1 is a block configuration diagram of a single lens reflex digital camera system including a driving device according to a first embodiment of the present invention.

A single lens reflex digital camera system 100 to which a driving device according to a first embodiment of the present invention is applied comprises a body unit 101 on the camera main unit side, and a lens unit 102 serving as an interchangeable lens barrel unit, as illustrated in the block configuration diagram of the present camera system in FIG. 1.

The lens unit 102 of the camera system 100 is capable of auto focus (AF) driving and manual focus (MF) driving, each of which employs an ultrasonic actuator as a driving source or an auxiliary driving source. Note that the manual focus driving provides an amount-of-force of operating-ring adjusting mode, and two adjusting modes are selectable in this mode. One mode is an operating-ring operating-force auxiliary mode for allowing a user to operate an operating ring 7 (FIG. 10), which is manually turned by the user at the time of manual focus, with a small operating force by applying auxiliary driving force to the ultrasonic actuator. The other mode is an operating-ring turning frictional-force reduction mode for allowing the user to switch the operating ring 7 from a fixed state to a readily capable-of-turning state by driving the ultrasonic actuator to change the turning frictional force of a distance ring 6 firmly fixed to the operating ring 7 so as to set the turning frictional force (load torque) in the range of a small turning frictional force state from a great turning frictional force state (fixed state). However, the camera system 100 may be configured wherein of the two adjusting modes of the amount-of-force of operating-ring adjusting mode, only any one of the modes is applied.

Description will be made regarding the configuration and operation of the ultrasonic actuator serving as the driving source of the lens unit (lens barrel unit) which is the driving device, or serving as the auxiliary driving source with reference to FIG. 1 through FIG. 13, and so forth prior to the detailed description of the single lens reflex digital camera system 100.

Note that with the following description, let us say that the direction parallel to a photographing lens optical axis O of the lens unit is a Z direction, the subject side in the Z direction is forward, the camera body side in the Z direction is rearward, the radial direction as to the optical axis O is an R direction, and the circumferential tangent direction as to the optical axis O is a T direction.

Figure 10:
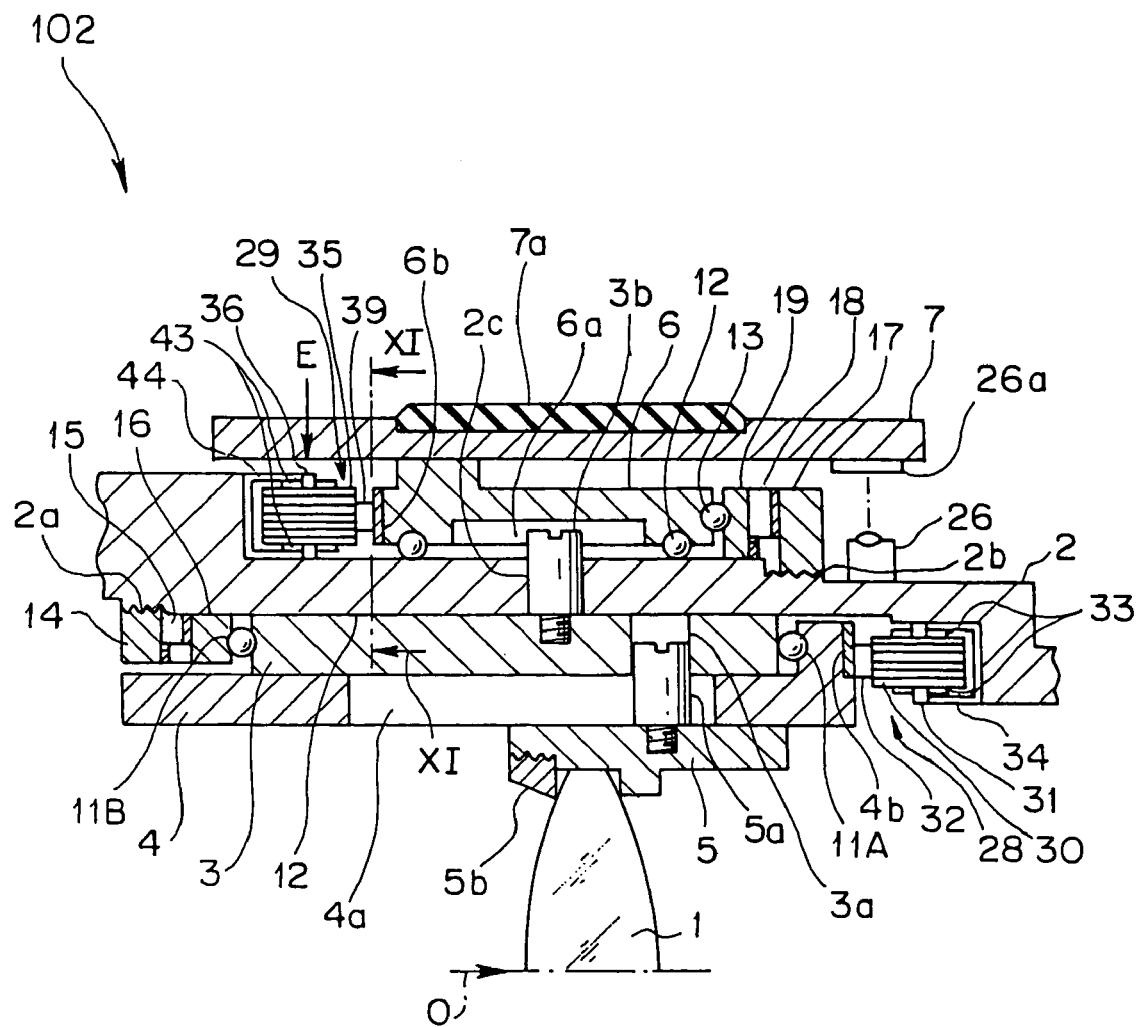
FIG. 10 is a cross-sectional view along the optical axial direction illustrating the principal components of a lens barrel unit of a lens unit in the camera system in FIG. 1.

The ultrasonic actuators to be built in the driving device made up of an optical member to be included in the lens unit 102 are three (second) ultrasonic actuators 28 serving as a focus driving second driving mechanism (driving member) illustrated in FIG. 10 disposed on the circumference at generally equal intervals, and three (first) ultrasonic actuators 29 serving as a operating-ring amount-of-force adjusting first driving mechanism (driving mechanism) disposed on the circumference at generally equal intervals.

The ultrasonic actuator 28 comprises a transducer 30 serving as a vibrator, supporting axis 31, driver 32, and case 34, as illustrated in FIG. 10, and performs focus driving (AF driving) of the lens of the lens unit 102.

Figure 13:
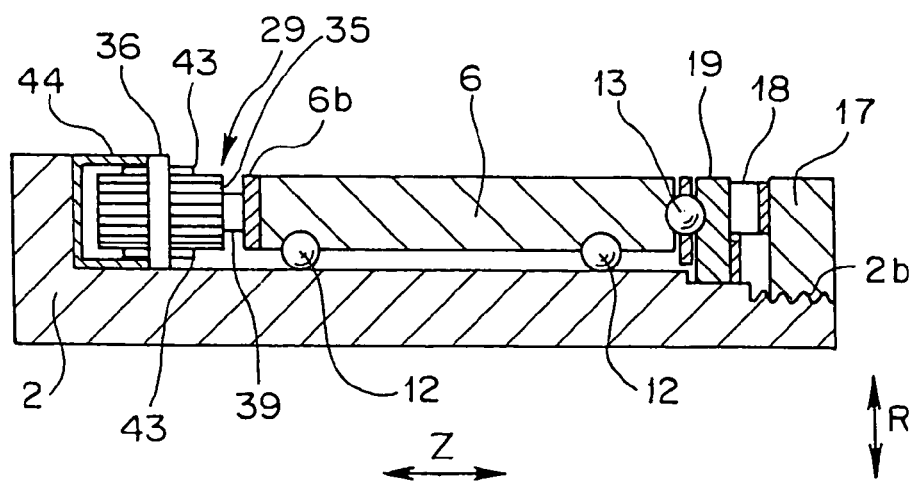
FIG. 13 is a cross-sectional view along line XIII-XIII in FIG. 12.

The ultrasonic actuator 29 comprises a transducer 35 serving as a vibrator, supporting axis 36, driver 39, and case 44, as illustrated in FIGS. 10 and 13, and is driven at the time of manual focus.

Next, description will be made regarding the transducers, but the transducer 30 serving as a vibrator of the ultrasonic actuator 28 has the same configuration as the transducer 35, and performs the same operation as the transducer 35. Accordingly, description will be made below principally regarding the transducer 35 of the ultrasonic actuator 29 in detail.

Figure 4:
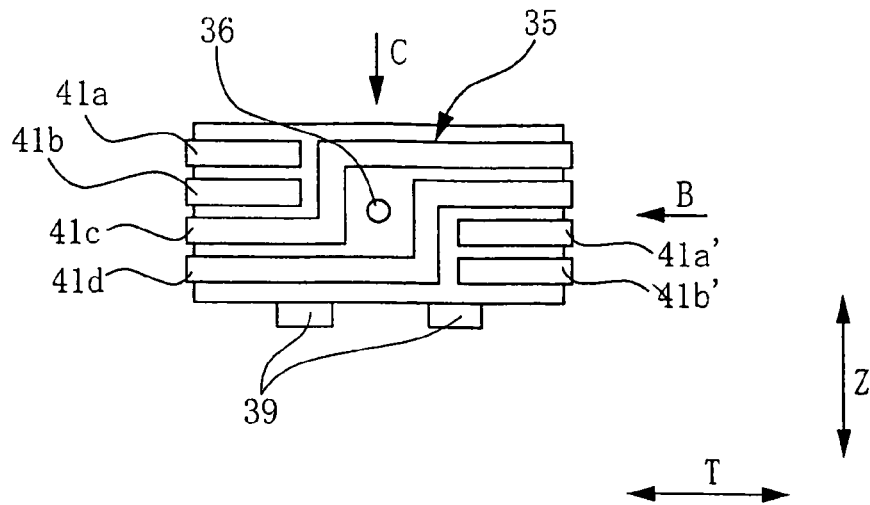
FIG. 4 is a diagram illustrating a state in which the flexible printed board is removed from the transducer in FIG. 2 as viewed from the supporting axial direction.
Figure 7:
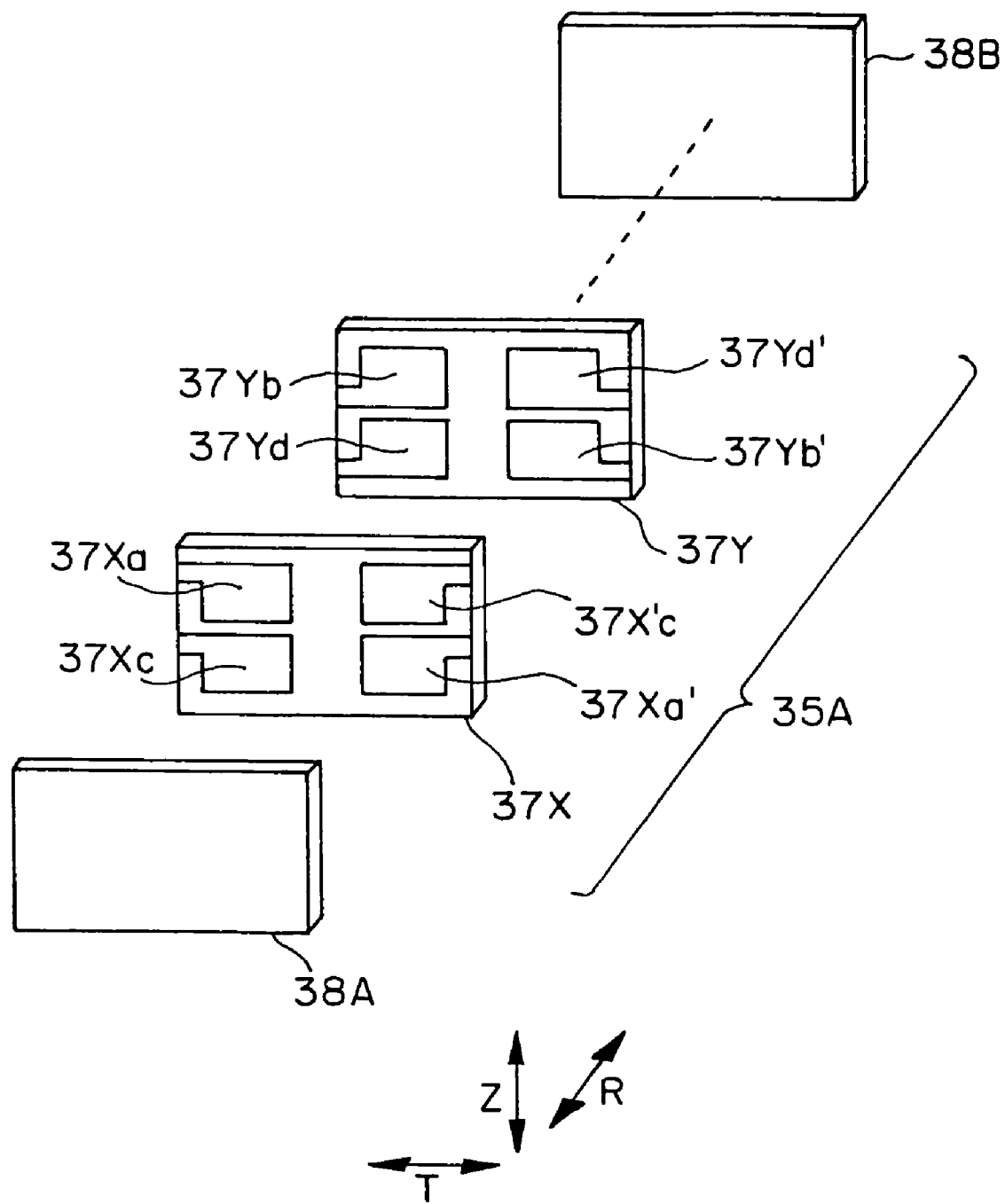
FIG. 7 is a disassembled perspective view of a piezoelectric device portion and an insulating plate comprising the transducer in FIG. 2 prior to a baking process.
Figure 8A:
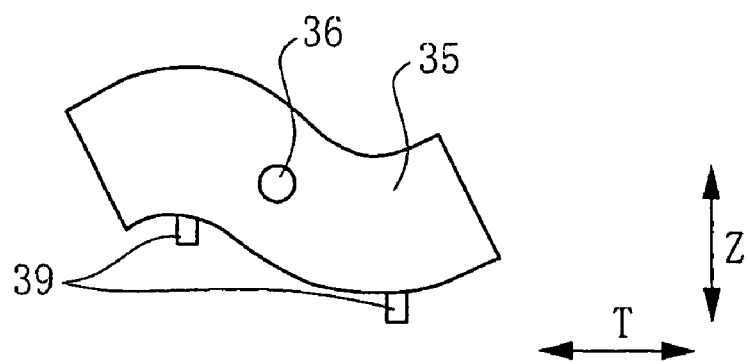
FIG. 8A is an enlarged view of a synthesized vibration state (flexion distorted state) of flexion vibration and axial vibration in the transducer in FIG. 2.
Figure 8B:
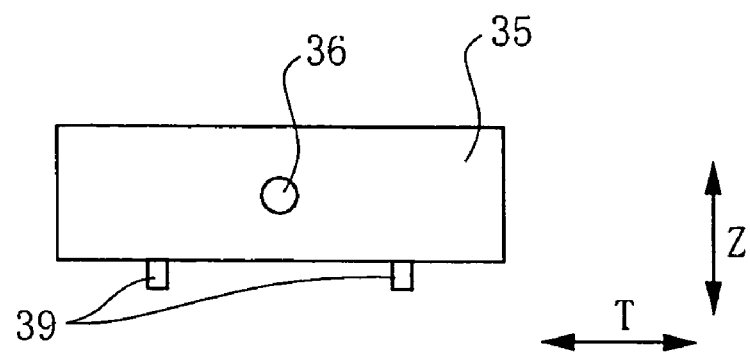
FIG. 8B is an enlarged view of a synthesized vibration state (stretching distorted state following flexion) of flexion vibration and axial vibration in the transducer in FIG. 2.
Figure 8C:
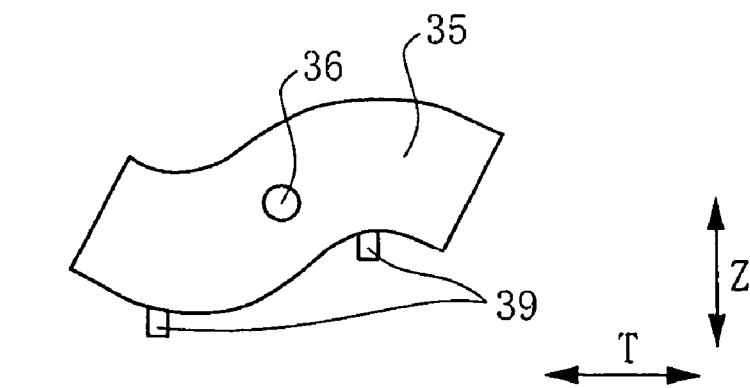
FIG. 8C is an enlarged view of a synthesized vibration state (flexion distorted state following stretching) of flexion vibration and axial vibration in the transducer in FIG. 2.
Figure 8D:
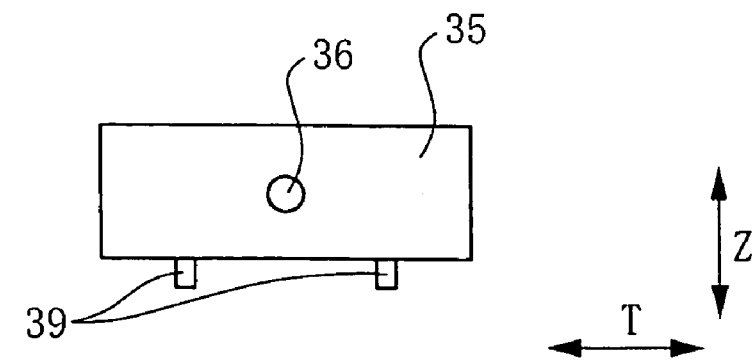
FIG. 8D is an enlarged view of a synthesized vibration state (contraction distorted state following flexion) of flexion vibration and axial vibration in the transducer in FIG. 2.

The transducer 35 comprises multiples of two types of piezoelectric sheets 37X and 37Y, two insulating plates 38A and 38B, electrodes 41a, 41b, 41c, 41d, 41a' and 41b' formed of electroconductive silver paste, one supporting axis 36, and two drivers, as illustrated in FIGS. 4 and 7 and the like.

The piezoelectric sheets 37X and 37Y of two types are each made up of a rectangular piezoelectric device with a thickness of 100 µm or so.

On the piezoelectric sheet 37X, first internal electrodes 37Xa, 37Xc, 37Xc', and 37Xa', on each front face of which silver-palladium alloy with a thickness of 10 µm or so is applied, are separately disposed in insulated four regions. The upper side end portion of each internal electrode extends to the end face position in the longitudinal direction of the piezoelectric device (FIG. 7).

On the other hand, on the piezoelectric sheet 37Y, second internal electrodes 37Yb, 37Yd, 37Yd', and 37Yb', on each surface of which silver-palladium alloy with a thickness of 10 µm or so is applied, and separately disposed in four insulated regions. The lower side end portion of each internal electrode extends to the end face position in the longitudinal direction of the piezoelectric device.

As illustrated in FIG. 7, with the piezoelectric sheet 37X and piezoelectric sheet 37Y being adjacent each other, the first internal electrodes 37Xa, 37Xc, 37Xc', and 37Xa' and the second internal electrodes 37Yb, 37Yd, 37Yd', and 37Yb' have the same shape, but the electrode end of the first internal electrodes and that of the second internal electrodes are turned upside down, so that both are disposed at positions where both rectangular electrode faces are superimposed on each other when being laminated. The two types of piezoelectric sheets 37X and 37Y, on which such internal electrodes are provided, are alternately laminated for 40 layers or so, thereby forming a laminated piezoelectric device unit 35A.

Figure 5:
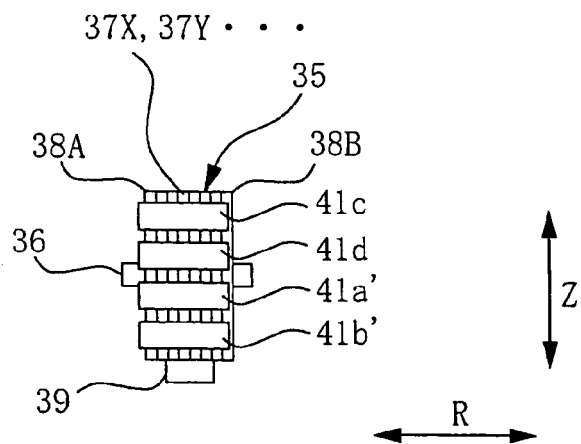
FIG. 5 is a view along arrow B in FIG. 4.
Figure 6:
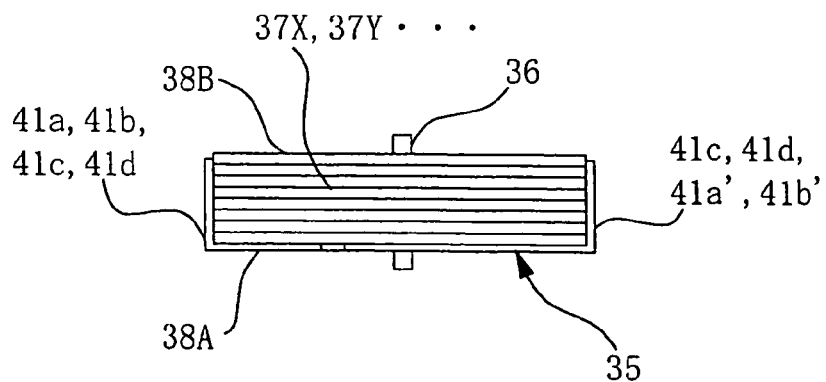
FIG. 6 is a view along arrow C in FIG. 4.

An internal electrode exposed portion (not shown) in which the end portions of the first internal electrodes 37Xa and 37Xc and the second internal electrodes 37Yb and 37Yd are exposed in a laminated layer state is formed on the left side end face of the laminated piezoelectric device unit 35A. An internal electrode exposed portion (not shown) in which the end portions of the first internal electrodes 37Xc' and 37Xa' and the second internal electrodes 37Yd' and 37Yb' are exposed in a laminated layer state is formed on the right side end face of the laminated piezoelectric device unit 35A. Further, four isolated external electrodes each made up of electroconductive silver paste are formed on both side faces on the internal electrode exposed portion, and are electrically connected with the internal electrodes (FIG. 5).

The insulating plates 38A and 38B having the same rectangular shape as the piezoelectric sheets 37X and 37Y are disposed on the front and rear faces of the laminated piezoelectric device unit 35A, thereby forming the surface of the transducer 35. Electrodes 41a (A1+), 41b (A1−), 41c (A2+), 41d (A2−), 41a' (B1+), and 41b' (B1−), which are made up of electroconductive silver paste illustrated in FIG. 4, are formed on the surface on the front face side of the insulating plate 38A.

The electrodes 41a, 41b, 41c, 41d, 41a', and 41b' on the insulating plate 38A are each electrically connected with the internal electrodes exposed on both side faces of each piezoelectric sheet in a laminated state. More specifically, the electrode 41a is electrically connected with the first internal electrode 37Xa. The electrode 41b is electrically connected with the second internal electrode 37Yb. The electrode 41c is electrically connected with the first internal electrode 37Xc and the first internal electrode 37Xc'. The electrode 41d is electrically connected with the second internal electrode 37Yd and the second internal electrode 37Yd'. The electrode 41a' is electrically connected with the first internal electrode 37Xa'. The electrode 41b' is electrically connected with the second internal electrode 37Yb'.

The laminated piezoelectric device unit 35A made up of the piezoelectric sheets 37X and 37Y laminated in the aforementioned electrode-connected state, which is superimposed with the insulating plates 38A and 38B, is subjected to a baking process, and then the transducer 35 is formed by performing polarization using the aforementioned respective electrodes (FIG. 4).

Two drivers 39 are firmly fixed to the bottom portion in the Z direction of the transducer 35 along the T direction using an adhesive. Note that each driver 39 is formed by dispersing alumina on a polymeric material.

Further, a through hole is opened on the generally center portion of the transducer 35, i.e., the position to become a vibration node of the transducer, in the laminated direction, and the supporting axis 36 made up of a stainless member or the like passes through this through hole in the R direction, and is adhered and fixed.

A connection flexible printed cable (hereinafter, referred to as FPC) 42 having connection patterns is mounted on the electrodes 41a, 41b, 41c, 41d, 41a' and 41b' provided on the insulating plate 38A of the transducer 35 with each electrode electrically connected therewith.

Figure 2:
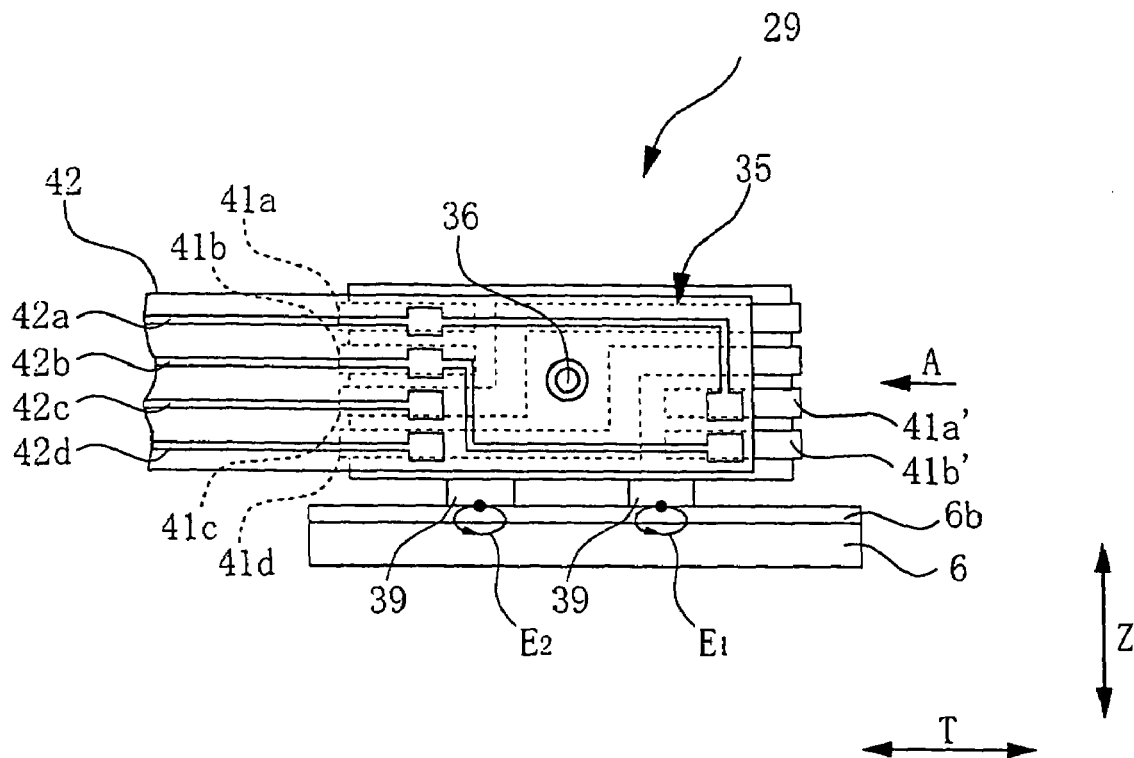
FIG. 2 is a diagram illustrating a state in which a flexible printed board is fixed to a transducer of an ultrasonic actuator to be applied to the camera system in FIG. 1 as viewed from the supporting axial direction.
Figure 3:
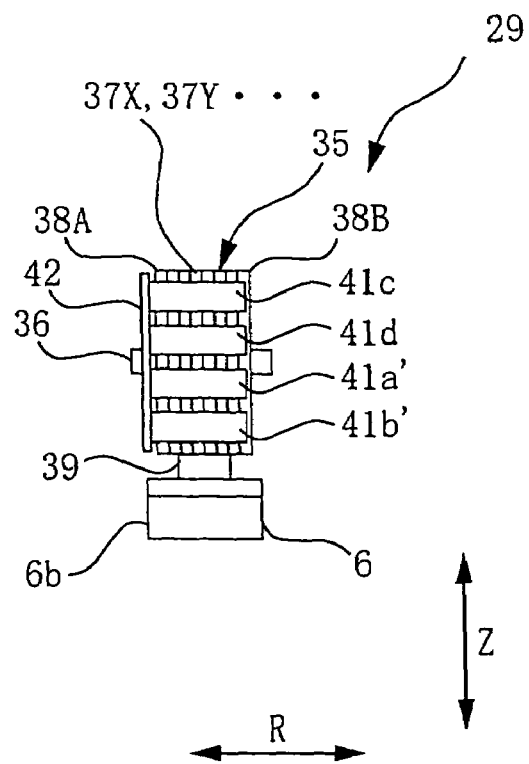
FIG. 3 is a view along arrow A in FIG. 2.

More specifically, the connection FPC 42 includes signal lines 42a, 42b, 42c, and 42d serving as connection patterns as illustrated in FIG. 2, and the signal line 42a (A1+ side) is connected with both electrodes 41a and 41a' of the insulating plate 38A. The signal line 42b (A1− side) is connected with both electrodes 41b and 41b'. The signal line 42c (A2+ side) is connected with the electrodes 41c. The signal line 42d (A2− side) is connected with the electrodes 41d. The signal lines 42a, 42b, 42c, and 42d are connected to a later-described transducer driving circuit 24.

Figure 11:
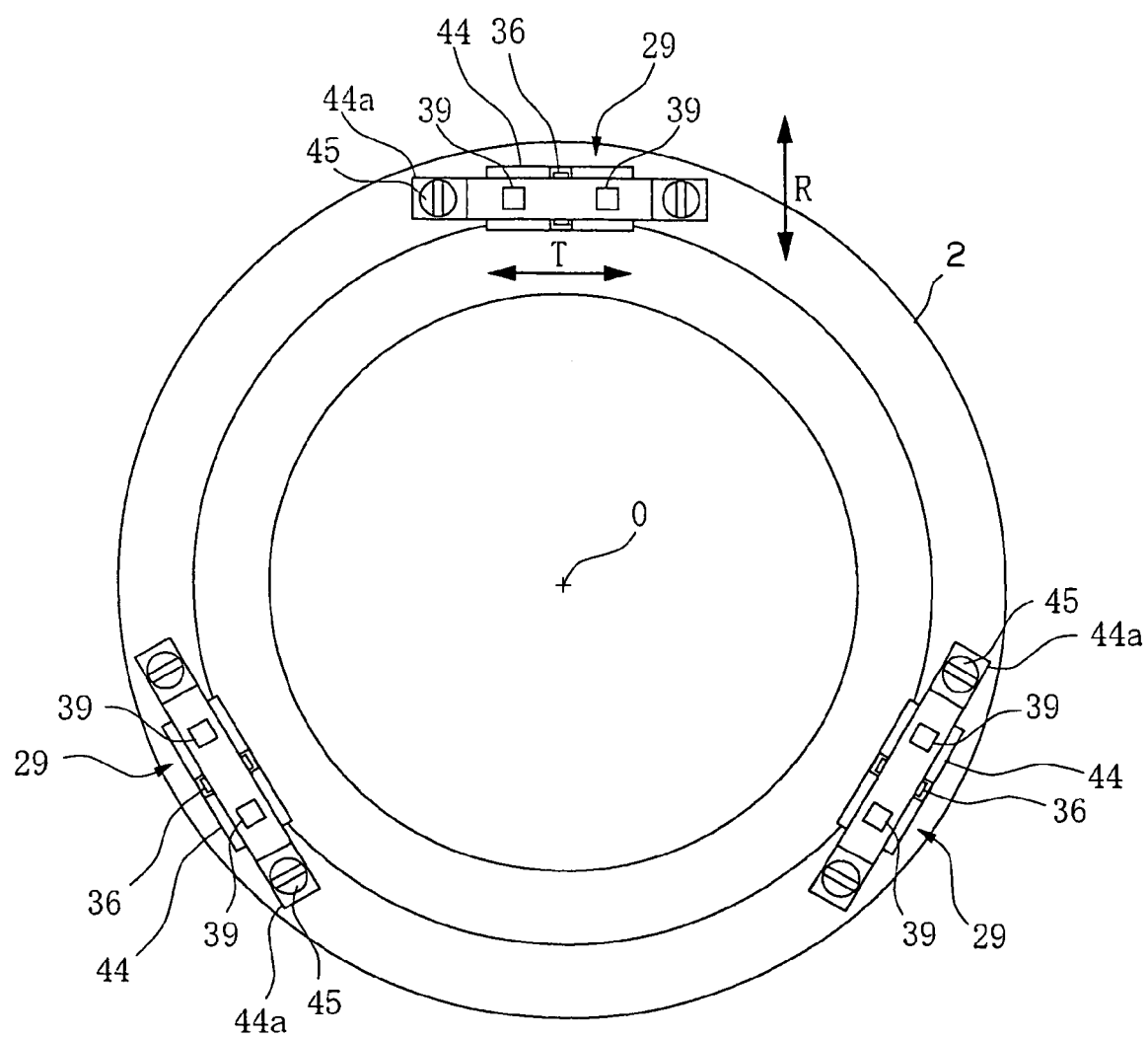
FIG. 11 is a cross-sectional view along line XI-XI in FIG. 10.

With the ultrasonic actuator 29, the supporting axis 36 of the transducer 35 is supported by a V-shaped groove 44b of the case 44 in a state in which the spacers 43 are sandwiched so as to turn as illustrated in FIGS. 10 through 13, and the attachment portions 44a of the case 44 are firmly fixed to a fixing frame 2 with two screws 45. An actuator mounted state is formed by pressing the two drivers 39 firmly fixed to the transducer 35 against a sliding portion 6b of the distance ring 6 serving as a driven member. The attachment positions thereof are three positions in the perimeter direction on the thrust face of the fixing frame 2 (FIG. 11).

On the other hand, with the ultrasonic actuator 28, the supporting axis 31 of the transducer 30 having the same configuration as the transducer 35 is firmly fixed and attached to the fixing frame 2 of the lens unit 102 in a state in which the spacer 33 is sandwiched with as illustrated in FIG. 10. The attachment positions thereof are three positions in the perimeter direction on the thrust face of the fixing frame 2 of the lens unit 102. Subsequently, two drivers 32 on the transducer 30 side are pressed against a sliding portion 4b of an internal driving ring 4 serving as a driven member.

Similarly, a connection FPC to be connected to the internal electrodes of the piezoelectric sheet of the transducer 30 is provided on the ultrasonic actuator 28, and this connection FPC is connected to a later-described transducer driving circuit 23.

Next, description will be made regarding operation of the transducers of the ultrasonic actuators with reference to FIGS. 8A through 8D, 9, and the like.

The transducer 35 of the ultrasonic actuator 29 is built in the body unit 101 side, and is controlled based on a control signal from a control unit of a body control microcomputer (hereinafter, referred to as Bμcom) 50, and detection signals from a phase-contrast detecting unit 48 and a current detecting unit 49 serving as vibration information detecting units of a lens control microcomputer (hereinafter, referred to as Lμcom) 20 to be built in the lens unit 102 side, and is driven by a transducer driving circuit 24 serving as a first amount-of-force switching means (vibrator control means) made up of an oscillating unit 45, phasing unit 46, and driving unit 47 illustrated in FIG. 9.

Similarly, the transducer 30 of the ultrasonic actuator 28 is controlled by the Bμcom 50 and Lμcom 20, and is driven by a circuit made up of a transducer driving circuit 23 (FIG. 1) serving as a second amount-of-force switching means having generally the same configuration as the first amount-of-force switching means.

Figure 9:
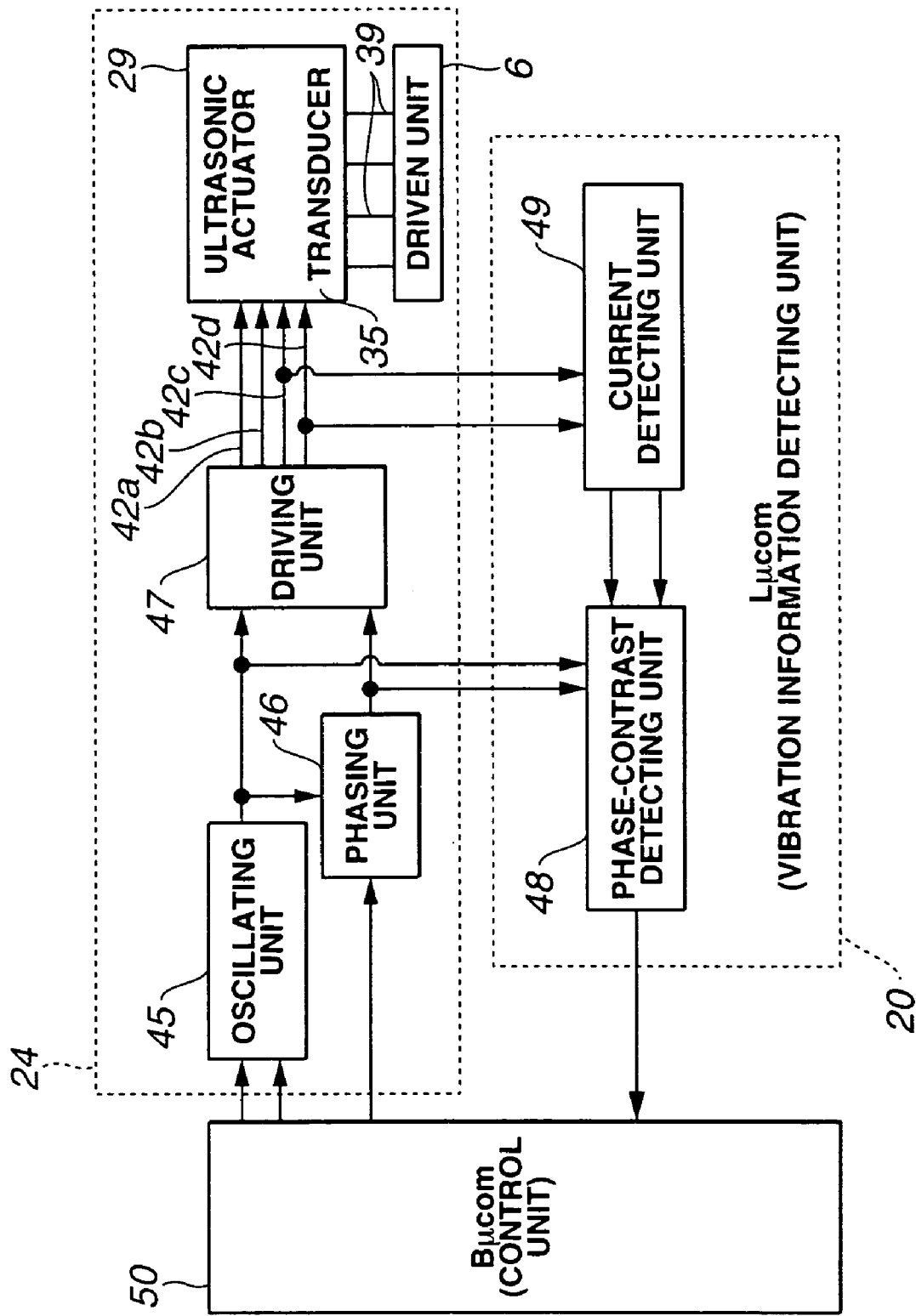
FIG. 9 is a block configuration diagram of a driving control circuit for driving the transducer in FIG. 2.

With the driving circuit in FIG. 9, a signal from the oscillating unit 45 is directly input to a couple of the signal lines 42a and 42b (A1+ and A1−) of the driving unit 47 without any change, and is also input to another couple of the signal lines 42c and 42d (A2+ and A2−) of the driving unit 47 with the phase of the input signal shifted by 90° through the phasing unit 46.

More specifically, of the input signals not passing through the phasing unit 46, one signal is voltage-amplified with the phase thereof being unchanged, and is output to the signal line 42a of the connection FPC 42 as a first signal (A1+). The other signal is voltage-amplified with the phase thereof being shifted by 180° as to the first signal, and is output to the signal line 42b as a second signal (A1−).

On the other hand, of the input signals of which the phase is shifted by 90° passing through the phasing unit 46, one signal is voltage-amplified with the phase thereof being unchanged, and is output to the signal line 42c as a third signal (A2+). The other signal is voltage-amplified with the phase thereof being shifted by 180° as to the third signal, and is output to the signal line 42d as a fourth signal (A2−).

Vibration in which flexion vibration and axial vibration are synthesized occurs (FIGS. 8A through 8D) at the transducer 35 by inputting the first through fourth signals to the transducer 35, and the transducer 35 generates elliptical vibration (illustrated with trajectories E1 and E2 in FIG. 2) with the phase being shifted at the tip of the driver 39. The distance ring 6 serving as a driven member is pressed against the tip of the driver 39, so relative driving force is applied to the distance ring 6 serving as a driven member via the driver 39 of the transducer 35 in the rotational direction of the elliptical vibration.

Note that the turning direction of the driving force applied to the distance ring 6 is determined by the rotational direction of the elliptical vibration of the driver 39, but the rotational direction is set by the direction where the phase is shifted by the phasing unit 46.

That is to say, as described above, in the case in which the transducer 35 generates vibration by synthesizing flexion vibration and axial vibration, the phasing unit 46 is controlled to shift the phase by 90°, on the other hand, in the case in which the transducer 35 generates only flexion vibration, and generates vibration in the thrust direction alone at the driver 39, the phasing unit 46 is controlled to shift the phase by 0° or 180°. These driving operation states will be described later in detail.

The current detecting unit 49 within the Lμcom 20 for detecting the current of a frequency signal to be applied to the transducer serving as a parameter representing a vibration state is connected to the driving signal line of the transducer 35. Further, the phase-contrast detecting unit 48 within the Lμcom 20 for detecting the phase contrast between the voltage of the frequency signal from the oscillating unit 45 and the current detected by the current detecting unit 49 is connected to the current detecting unit 49. Also, the control unit within the Bμcom 50 for acquiring the phase contrast signal between the detected current and voltage is connected to the phase-contrast detecting unit 48. The control unit is connected with the oscillating unit 45.

The phase-contrast detecting unit 48 detects the phase contrast between the current and voltage serving as parameters of a vibration state of the transducer 35, and the control unit can detect a frequency near the resonant frequency of the transducer 35 in a vibration state changed by external environment based on the detected phase contrast between the current and voltage. Note that the detected frequency near the resonant frequency is fed back to the oscillating unit 45.

Note that with the present embodiment, the signal to be applied to the transducer 35 has been taken as a frequency signal, but not restricted to this, a rectangular wave signal, sinusoidal signal, or saw-tooth wave signal may be employed instead. Also, with the present embodiment, the phase contrast between the voltage of the frequency signal of the oscillating unit 45 and the current of the frequency signal to be applied to the transducer has been taken as the phase contrast detected by the phase-contrast detecting unit 48, but not restricted to this, the voltage and current of the frequency signal to be applied to the transducer may be employed instead.

As described above, with the ultrasonic actuator 28 according to the present embodiment, the phase contrast between the current of the frequency to be applied to the transducer 35 and the voltage of the frequency signal from the oscillating unit 45 detected by the phase-contrast detecting unit 48 is input to the control unit of the Bμcom 50, and a frequency near the resonant frequency of the transducer 35 at the time of performing frequency detection operation is detected. The results thereof are fed back to the oscillating unit 45, thereby detecting a frequency near the resonant frequency and driving the transducer with the detected frequency even if the resonant state of the transducer 35 is changed in accordance with change in external factors, resulting in yielding an advantage for driving the transducer 35 with excellent driving efficiency. Note that this driving control may be performed on the transducer 30 of the ultrasonic actuator 28 in the same way.

Note that of the operating-ring amount-of-force adjusting mode at the time of manual focus, the case of the phasing unit 46 shifting the phase by 90° is the case of performing driving control in the operating-ring operating-force auxiliary mode, or the case of performing AF driving by the transducer 30. On the other hand, of the operating-ring amount-of-force adjusting mode, in the operating-ring turning frictional-force reduction mode, the phasing unit 46 shifts the phase by 0° or 180°, and the transducer 35 is driven by flexion standing wave vibration alone without axial vibration.

Next, description will be made in detail regarding the configuration and operation of an single lens reflex digital camera system containing an optical member driving device according to the present embodiment with reference to FIGS. 1, 10 through 13, and the like.

The single lens reflex digital camera system 100 according to the present embodiment comprises, as described above, the body unit 101 serving as a camera main unit, and the lens unit 102 serving as an interchangeable lens barrel unit, and the desired lens unit 102 can be detachably mounted on the front face of the body unit 101.

The Lμcom 20 controls the lens unit 102. The Bμcom 50 controls the body unit 101. Note that the Lμcom 20 and Bμcom 50 are electrically connected via a communication connector 69 in a lens barrel mounted state so as to communicate with each other. The Lμcom 20 runs as a digital camera system in dependent collaboration with the Bμcom 50. The Bμcom 50 and Lμcom 20 contain control means for controlling the driving states of the ultrasonic actuators 28 and 29, first switching control means for switching the operating ring 7 to a fixed state or to an operable unfixed state by controlling the ultrasonic actuator 29 and the vibrator control means for controlling the vibrators of the ultrasonic actuators 28 and 29, second switching control means for switching the second connecting mechanism to a fixed state or to an unfixed state bringing the lens frame 5 to a driving state via the second connecting mechanism by controlling the ultrasonic actuator 28, and amount-of-force adjusting means for adjusting the manual operating force of the operating ring 7 by controlling the ultrasonic actuator 29, and the like other than the control unit for controlling the aforementioned units.

Provided within the lens unit 102 are the Lμcom 20 for performing control within the lens unit 102, the fixing frame 2, the operating ring 7 and distance ring 6 serving as manual operating members (operating members), the internal and external driving rings 3 and 4 serving as driving mechanisms, the lens frame 5 serving as a moving member, the frame member including the lens driving mechanisms (first driving mechanism and second driving mechanism) and the like, a lens 1 comprising the photographing lens supported by the driving ring and the like so as to advance and retreat and optical members other than the lens, a diaphragm 8, the frame member driving ultrasonic actuators 28 and 29, frame member (operating ring and internal driving ring) turning position detecting sensors 26 and 27, a diaphragm driving mechanism 22, the actuator driving transducer driving circuits 23 and 24, and the like.

The lens 1 is a focus lens, and is held in the lens frame 5, the lens frame 5 is driven by the ultrasonic actuator 28 (FIG. 2 and FIG. 10) described later within the fixing frame 2 containing a lens driving mechanism so as to advance and retreat, and is capable of AF focusing (automatic focusing) driving, and is capable of manual focusing driving by operating the operating ring 7 as well. Description will be made later in detail regarding the lens driving mechanism. Note that a photographing lens other than the lens 1 is also built in the lens unit 102, but not illustrated in FIG. 1.

The operating ring 7 is manually turned at the time of manual focusing, and is disposed on the perimeter portion of the lens unit 102 so as to perform rotational operations, and a rubber ring 7a is firmly fixed on the perimeter portion thereof, and the distance ring 6 is firmly fixed on the inner circumferential portion. The transducer 35 serving as a vibrator of the ultrasonic actuator 29 (FIG. 2 and FIG. 10) described later within the fixing frame 2 is pressed against the distance ring 6 from the Z direction via a later-described operating-ring amount-of-force adjusting mechanism.

Though the transducer 35 pressed against the distance ring 6 vibrates by receiving output from the transducer driving circuit 24 at the time of manual focus driving, of the above-described two operating-ring amount-of-force adjusting modes, driving flexion vibration and axial vibration generates driving force for aiding turning operations of the operating ring 7 so as to turn lightly in the operating-ring operating-force auxiliary mode. Also, of the aforementioned two modes, in the operating-ring turning frictional-force reduction mode, the transducer 35 is subjected to flexion standing-wave vibration so as to change frictional contact force as to the driver 39 of the transducer 35 abutting with the distance ring 6, thereby arbitrarily setting the amount of operating force of the operating ring 7 integrated with the distance ring 6.

The setting values regarding the amount of operating force of the operating ring 7 and the frictional contact force of the distance ring 6 are input and stored to the Bμcom 50 by an operating-ring amount-of-force setting switch 80 (hereinafter, switches will be abbreviated to "SW") serving as the operating-ring amount-of-force setting means of the body unit 101, and when a manual focus setting SW of camera operating SW group 79 is turned on, and also the operating ring 7 is in a operating state, the aforementioned setting values are output to the lens unit 102 side, and then input to the Lμcom 20. The Lμcom 20 controls the transducer driving circuit 24, and then controls the transducer 35 of the ultrasonic actuator 29, and thus, the auxiliary turning force of the distance ring 6 or the frictional contact force as to the distance ring 6 is adjusted.

An unshown stepping motor within the diaphragm driving mechanism 22 drives the diaphragm 8. This motor is controlled in accordance with the commands of the Lμcom 20.

On the other hand, the following component members are disposed within the body unit 101 as illustrated in FIG. 1. That is to say, the Bμcom 50 controlling the entire camera, and including the amount-of-operating-force adjusting control means, and as a photographing system, a quick return mirror 51, shutter device 53, optical lowpass filter 54, CCD unit 55 having an electronic conversion device for subjecting a subject image to photoelectrical conversion, screen 56, penta prism 57, eyepiece 58, mirror driving mechanism 59, shutter charging mechanism 60, shutter control circuit 61, AF (auto focus) sensor unit 63 serving as focusing start signal output means, AF sensor driving circuit 62, photometric sensor 64, photometric circuit 65, electronic flash 67, and electronic flash control circuit 66 are disposed. As display operating system and the like, an operation display LCD 78 for notifying a user of an operation state of the camera by display output, camera operating SW group 79, and amount-of-operating-force setting SW 80 serving as amount-of-operating-force setting means are disposed. Further, as photographing processing and a display system, a CCD interface circuit 72 to be connected to the CCD unit 55, an image processing controller 73, SDRAM 76 serving as a storage region, FLASH ROM 75, recording medium 74, liquid crystal monitor 77 displaying photographing images and the like are provided. Also, as nonvolatile storage means for storing a predetermined control parameters necessary for camera control, nonvolatile memory 71 made up of EEPROM for example accessible from the Bμcom 50, and as a power source system, a battery 81, power source circuit 82 for converting a battery voltage into a voltage necessary for each circuit unit comprising the camera system, and supplying this to each circuit unit are disposed.

With the body unit 101 to which the lens unit 102 is mounted, the subject light reflected in the vertical direction by the quick return mirror 51 from the lens 1 forms an image on the screen 56 in a finder observing state. The light ray from the image is guided to the eyepiece 58 provided for observing a subject image on the screen 56 by the penta prism 57, whereby the user can observe the subject image. The photometric circuit 65 performs photometric processing based on the electrical signal output from the photometric sensor 64 which converts the light from the screen 56 into an electrical signal, and the output from the photometric circuit 65 is transmitted to the Bμcom 50, where exposure control at the time of photographing is performed. Part of the light flux of the lens 1 passes through the quick return mirror 51 serving as a semi-transmitting mirror, and is guided by a sub mirror 51a, and is cast on the AF sensor unit 63. The output (focusing information) from an AF sensor within the AF sensor unit 63 is transmitted to the Bμcom 50 via the AF sensor driving circuit 62, where known distance measuring processing is performed. On the other hand, the quick return mirror 51 in a photographing state is driven to retreat to a position displaced from the photographing light path by the mirror driving mechanism 59, and the light ray of the lens 1 forms an image on the image-pickup surface of the CCD unit 55. The driving springs of front and rear curtains of the shutter device 53 are charged by the shutter charging mechanism 60, and the movement of the front and rear curtains at the time of photographing is controlled by the shutter control circuit 61.

The image processing controller 73 controls the CCD interface circuit 72 to acquire photographing image data from the CCD unit 55 based on the command of the Bμcom 50. This image data is converted into a video signal at the image processing controller 73, and is displayed on the liquid crystal monitor 77. The user can confirm the photographed image from the display image on the liquid crystal monitor 77.

The SDRAM 76 is temporary storage memory of image data, and is used for a work area when an image is converted. Also, this image data is converted into JPEG data, and then stored in the recording medium 74.

Note that the optical lowpass filter 54 is disposed between the CCD unit 55 disposed on the photographing lens optical axis O and the lens 1. This filter removes the high frequency components of an image incident to the CCD, and also protects the CCD.

The camera operating SW group 79 is a switch group including operating buttons necessary for operating the camera such as a release SW, mode switching SW for switching the auto focus mode and the manual focus mode (AF/MF mode switching), or selecting the operating-ring amount-of-force adjusting mode, power SW, and the like.

Now, description will be made regarding the details of the operating-ring amount-of-force adjusting mechanism and focus driving mechanism to be built in the lens barrel unit and the barrel of the lens unit 102 with reference to FIG. 10 through FIG. 13, and the like.

Figure 12:
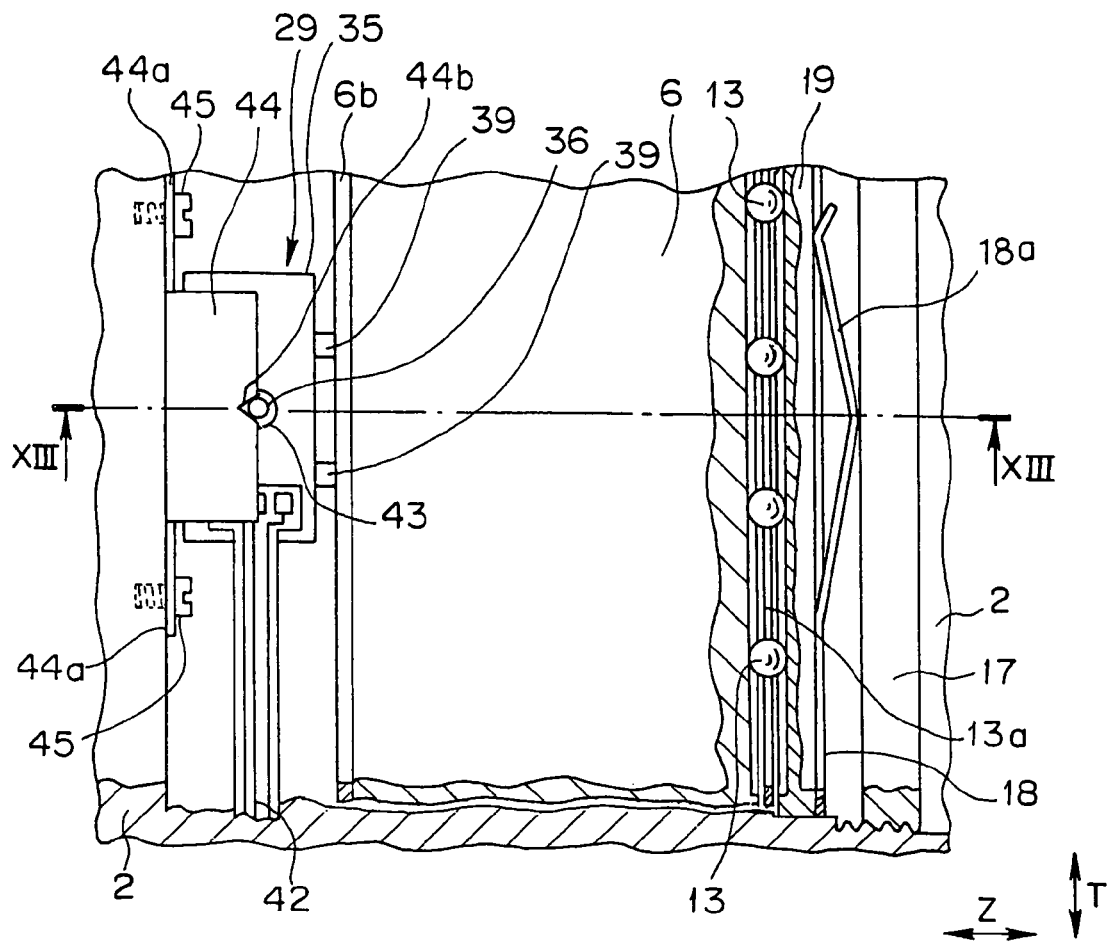
FIG. 12 is a development of FIG. 10 as viewed from the E direction.

As described above, FIG. 10 is a cross-sectional view along the optical axis illustrating the principal components of the lens barrel of the lens unit in the camera system according to the present embodiment. FIG. 11 is a cross-sectional view along line XI-XI of FIG. 10. FIG. 12 is a development of the lens barrel in FIG. 10 as viewed from the B direction. FIG. 13 is a cross-sectional view along line XIII-XIII in FIG. 12.

As illustrated in FIG. 10, the lens barrel unit comprises the fixing frame 2, the distance ring 6 supported on the perimeter portion of the fixing frame 2 so as to turn, the operating ring 7 for manual focus operations fixed and fitted in the perimeter of the distance ring 6, the external driving ring 3 fitted in the inner circumferential portion of the fixing frame 2 so as to turn, the internal driving ring 4 freely rotatably fitted in the inner circumferential portion of the external driving ring 3, the lens frame 5 fitted in the inner circumferential portion of the internal driving ring 4 so as to turn and retreat, the lens 1 serving as a focus lens pressed against the lens frame 5 by a lens presser foot 5b so as to be held, the operating-ring amount-of-force adjusting mechanism, which is built in the fixing frame 2 and distance ring 6, including the ultrasonic actuator 29, and the focus driving mechanism, which is built in the fixing frame 2, external driving ring 3, and internal driving ring 4, including the ultrasonic actuator 28.

With the operating ring 7, the rubber ring 7a is firmly fixed to the perimeter portion thereof, and the distance ring 6 is firmly fixed to the inner circumferential portion thereof with a screw (not shown). A rectilinear guide groove 6a along the optical axis O is provided on the inner circumference of the distance ring 6.

With the external driving ring 3, a cam groove 3a slanted relative to the optical axis O, for focusing driving of the lens 1 is provided, and a driving pin (first connecting mechanism) 3b is firmly fixed to the perimeter portion thereof. This driving pin 3b slidably passes through a circumferential groove 2c provided along the circumferential direction on the fixing frame 2, and is slidably fitted in the rectilinear guide groove 6a of the distance ring 6.

With the internal driving ring 4, a rectilinear guide groove 4a along the optical axis O is provided. With the lens frame 5, a driven pin (second connecting mechanism) 5a is firmly fixed to the perimeter portion thereof. This driven pin 5a slidably passes through the rectilinear guide groove 4a, and is slidably fitted in the cam groove 3a of the external driving ring 3.

With the operating-ring amount-of-force adjusting mechanism, as illustrated in FIGS. 10, 12, and 13, the distance ring 6 is held on the perimeter of the fixing frame 2 via a ball bearing 12 so as to turn, and also the rear end face of the distance ring 6 in the Z direction serving as the thrust direction is relatively positioned as to a bearing seat 19 via a ball bearing 13 so as to turn. A depressing spring 18 having a ring-shaped spring deformable contacting portion 18a serving as pressure means is in contact with the rear end face of the bearing seat 19. A presser foot ring 17 mounted on the perimeter of the fixing frame 2 and screwed with a screw portion 2b is in contact with the ring-shaped spring deformable contacting portion 18a of the rear face of the depressing spring 18, and presses the depressing spring 18 forward. Accordingly, the distance ring 6 is in a pressurized state forward in the Z direction. The ball bearing 13 is held by a retainer 13a having holes for holding the ball bearing 13 at an equal interval in the circumferential direction on the ring-shaped plate. Let us say that the ball bearing 12 is also held by a different-shaped retainer (not shown) in the same way.

On the other hand, the ultrasonic actuators 29 are attached to the tripartite positions (120° interval) in the perimeter direction on the front thrust face of the perimeter of the fixing frame 2 as illustrated in FIGS. 10 and 11. As already described above, the transducer 35 of the ultrasonic actuator 29 is attached in a state wherein the supporting axis 36 is supported by the V-shaped groove 44b of the actuator case 44 (FIG. 12) which is screwed in front of the fixing frame 2 with the screws 45 via the spacers 43 so as to turn. The two drivers 39 firmly fixed to the rear end face of the transducer 35 are positioned facing the front face of the distance ring 6 rearward in the Z direction. As described above, the distance ring 6 is depressed forward in the Z direction, so a state in which the front face of the distance ring 6 (a later-described sliding portion 6b) is in contact with the drivers 39 is provided (a state in which frictional contact force is applied).

A ring-shaped sliding portion 6b made up of a wear resistance material such as ceramic or the like is firmly fixed to the front face portion of the distance ring 6.

With the focus driving mechanism, as illustrated in FIG. 10, the front and rear thrust faces of the external driving ring 3 are supported by a bearing seat 16 and a flange portion of the internal driving ring 4 via ball bearings 11B and 11A. A depressing spring 15 having a ring-shaped spring deformable portion serving as pressure means is in contact with the front end face of the bearing seat 16. A presser foot ring 14 mounted on the perimeter of the fixing frame 2 and screwed with a screw portion 2a is in contact with the spring deformable portion of the front face of the depressing spring 15, and presses the depressing spring 15 rearward. Accordingly, the external driving ring 3 is pressurized rearward in the Z direction, and the internal driving ring 4 receives this pressure force, and is pressurized rearward in the same way. Note that let us say that the ball bearings 11A and 11B are held by a retainer (not shown).

On the other hand, the ultrasonic actuators 28 are attached to the tripartite positions (120° interval) in the perimeter direction on the rear thrust face of the inner circumference of the fixing frame 2 as with the ultrasonic actuators 29 as illustrated in FIG. 10. As already described above, the transducer 30 of the ultrasonic actuator 28 is attached in a state wherein the supporting axis 31 is supported by the V-shaped groove of the actuator case 34 which is screwed in the rear of the fixing frame 2 with screws via the spacers 33 so as to turn. The two drivers 32 firmly fixed to the front end face of the transducer 30 are supported while facing the rear end face of the internal driving ring 4 forward in the Z direction. The internal driving ring 4 is depressed rearward in the Z direction, so a state in which a later-described sliding portion 4b of the rear end of the internal driving ring 4 is in contact with the drivers 32 is provided.

A ring-shaped sliding portion 4b made up of a wear resistance material such as ceramic or the like is firmly fixed to the rear end face portion of the internal driving ring 4. The presser foot ring 14 is also made up of a wear resistance material such as ceramic or the like.

With the lens barrel unit thus configured, in the event that AF (auto focus) driving is performed, the ultrasonic actuator 28 is driven while the operating ring 7 is not turned but fixed (the stopping state of the ultrasonic actuator 29). Upon the transducer 30 being driven with flexion and axial vibration, the driver 32 is driven along an elliptic trajectory, and the internal driving ring 4 with which the driver 32 is in contact with a predetermined pressure force by the focus driving mechanism is driven so as to relatively turn as to the fixing frame 2 by focusing corresponding amount. The driven pin 5a relatively moves over the rectilinear guide groove 4a along the cam groove 3a in accordance with turning of the internal driving ring 4, and the lens frame 5 is moved to the focusing position of the lens 1 in the optical axial O direction, and then focusing is performed.

Note that with the state in which the ultrasonic actuator 29 is stopped, the sliding portion 6b of the distance ring 6 is in strong contact with the drivers 39, so frictional force becomes great, and accordingly, the distance ring 6 and operating ring 7 are held in a firmly fixed state.

On the other hand, in the event that manual focus driving is performed, the operating ring 7 is manually turned while the internal driving ring 4 is fixed (the stopping state of the ultrasonic actuator 28). With the stopping state of operation of the ultrasonic actuator 28, the internal driving ring 4 is in frictional contact with the driver 32 of the transducer 30, so is held in a state in which the internal driving ring 4 is fixed to the fixing frame 2. In the event that the manual focus operations are in the operating-ring turning frictional-force reduction mode of the operating-ring amount-of-force adjusting mode, first, upon the operating ring 7 being turned in the desired focusing direction with very-small-amount hand control, movement of a scale 26a provided on the operating ring 7 is detected by a position sensor 26 provided on the fixing frame 2, and the Lμcom 20 controls the transducer 35 of the ultrasonic actuator 29 to generate flexion standing-wave vibration alone so as to control the drivers 39 to vibrate in the thrust direction alone. According to this vibration, the friction force between the distance ring 6 and drivers 39 is reduced, and also the amount of operating force of the operating ring 7 is reduced, thereby facilitating manual operations. In this state, upon the operating ring 7 being manually turned, the external driving ring 3 turns since the driving pin 3b firmly fixed to the external driving ring 3 is engaged with the rectilinear guide groove 6a provided on the distance ring 6 and the circumferential groove 2c of the fixing frame 2. Upon the external driving ring 3 turning, the lens frame 5 moves forward in the optical axial O direction or rearward since the driven pin 5a provided on the lens frame 5 is engaged with the cam groove 3a of the external driving ring 3 and the rectilinear guide groove 4a provided on the internal driving ring 4, where manual focus driving is performed.

As described above, in the event that the Lμcom 20 controls the transducer 35 to generate flexion standing-wave vibration alone, the drivers 39 vibrate in the Z direction (thrust direction) alone, but this vibration in the thrust direction reduces the frictional contact force between the sliding portion 6b of the distance ring 6 and the drivers 39. Thus, the frictional force can be reduced to one tenth through one hundredth by this vibration in the thrust direction, for example. Due to this reduction of the frictional force, the amount of turning force of the distance ring 6 is smaller than that in the event that the transducer 35 is in a non-vibration state, thereby facilitating turning operations of the operating ring 7. Also, the greater the amplitude of the flexion standing-wave vibration of the transducer 35 is, the greater reduction degree of the frictional contact force between the sliding portion 6b of the distance ring 6 and the drivers 39 is, when the reduction degree becomes greater, the amount of turning force of the distance ring 6 becomes smaller. On the other hand, the smaller the amplitude is, the greater the amount of force necessary for turning operations of the operating ring 7. Accordingly, in the event that photographing is continued while the focus position once set is fixed, the operating ring 7 can be held in a generally locked state by extremely reducing the amplitude of the flexion standing-wave vibration of the transducer 35 or by stopping vibration of the transducer 35.

Note that in the event that the transducer 35 is controlled to generate only flexion vibration including no axial vibration components, with the transducer driving circuit in FIG. 9, the signal of the signal line 42c (A2+) passing through the phasing unit 46 is controlled to change the phase thereof by 0° or 180° as to the signal line 42a (A1+) serving as a reference signal. Also, in the event of changing the amplitude of the transducer 35, the amplitude of the transducer 35 can be readily changed by shifting the driving frequency of the transducer 35 from the resonant frequency, or by changing an applying voltage. Also, fractional force may be changed by changing the period for vibration applying to the distance ring 6 with an applying signal taken as a burst signal.

On the other hand, in the event that the manual focus operations are in the operating-ring operating-force auxiliary mode of the operating-ring amount-of-force adjusting mode, similarly, upon the operating ring 7 being turned in the desired focusing direction with very-small-amount hand control, movement (including a turning direction) of a scale 26a provided on the operating ring 7 is detected by the position sensor 26 provided on the fixing frame 2, and the Lμcom 20 controls the transducer 35 of the ultrasonic actuator 29 to generate flexion standing-wave vibration and axial vibration so as to control the drivers 39 to perform elliptic vibration in the desired direction. According to the elliptic vibration of the drivers 39, the distance ring 6 receives turning force in the desired direction, and the operating ring 7 and distance ring 6 are driven to turn while aiding the operating force of the operating ring 7 (a state in which the turning force of the distance ring 6 is added to the turning operating force of the operating ring 7), thereby performing manual focus driving. In this case, the distance ring 6 is never turned by the turning force of the transducer 35 alone. Similarly, the tuning driving force due to the transducer 35 may be changed by shifting the driving frequency from the resonant frequency, or by changing an applying voltage, or frictional force may be changed by changing the period for vibration applying to the distance ring 6 by taking an applying signal as a burst signal.

Next, description will be made regarding photographing sequence processing in the camera system 100 according to the present embodiment with reference to the block configuration diagram of FIG. 1, the flowcharts in FIGS. 14 and 15, and the like.

Figure 14:
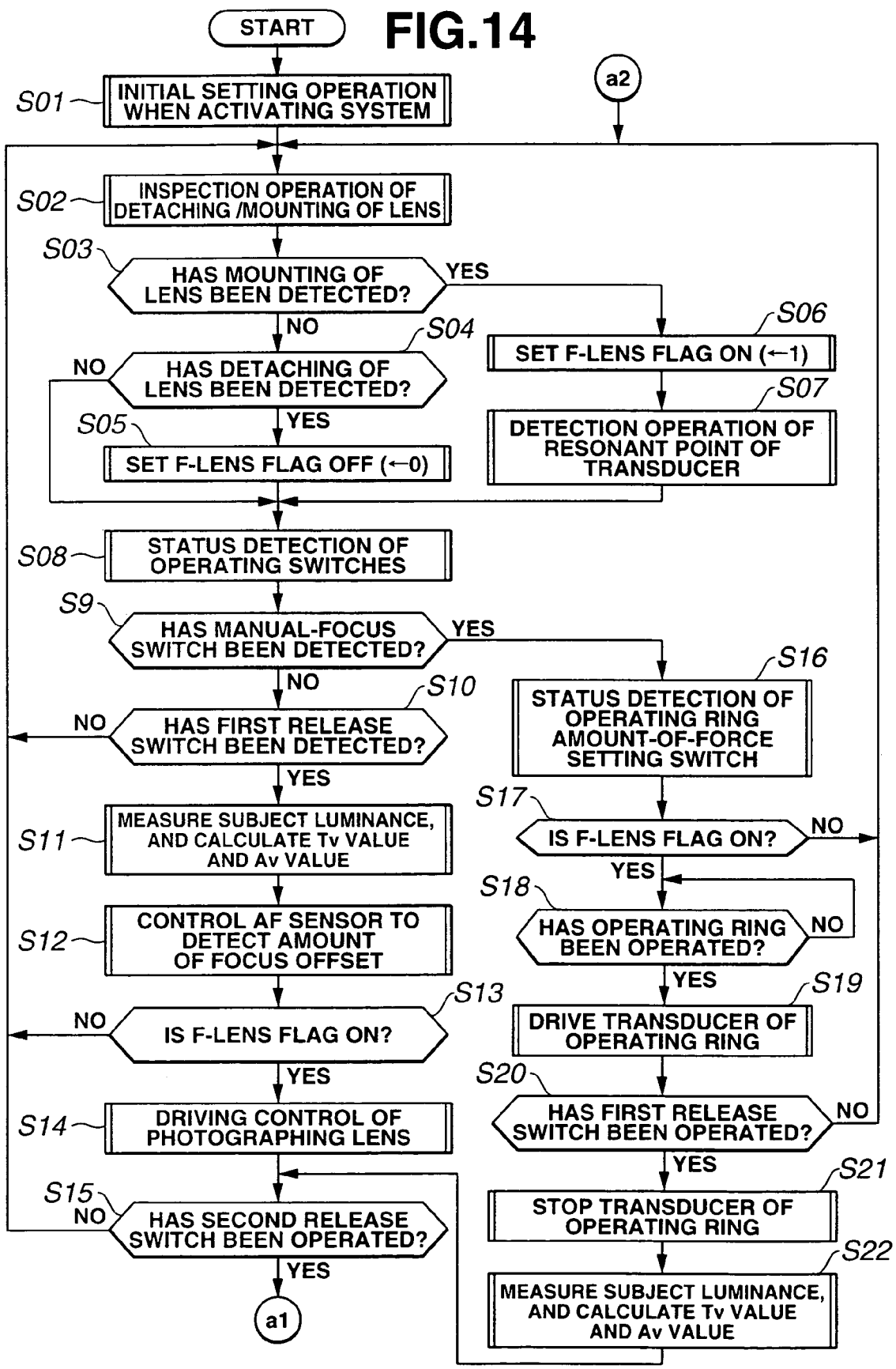
FIG. 14 is a part of a flowchart of the photographing sequence in the camera system in FIG. 1.
Figure 15:
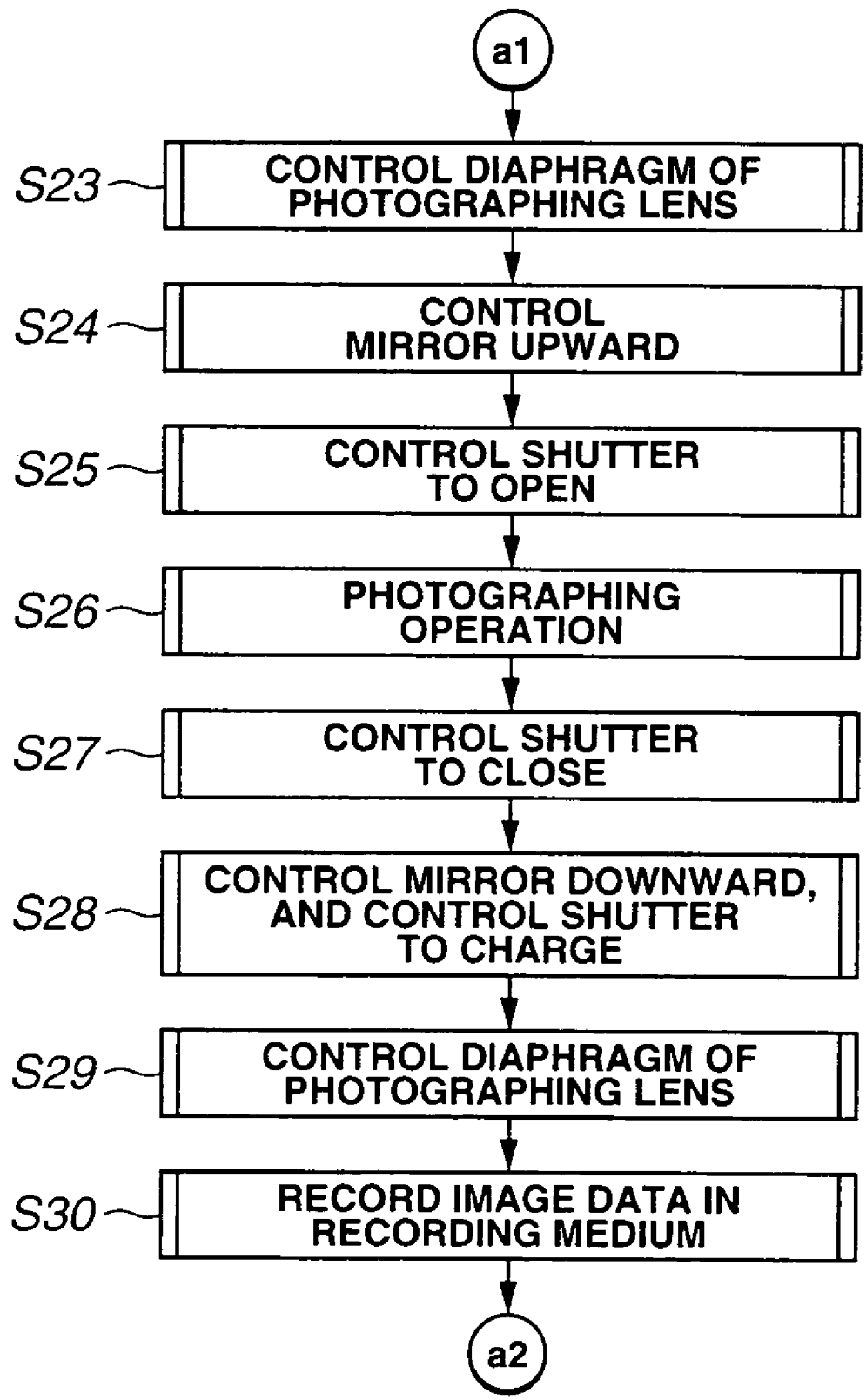
FIG. 15 is another part of the flowchart of the photographing sequence in the camera system in FIG. 1.

The photographing sequence processing illustrated in FIGS. 14 and 15 is processing to be performed under control of the Bμcom 50 in collaboration with the Lμcom 20.

First, upon the user turning on the power SW (included in the camera operating SW group 79) of the body unit 101, the Bμcom 50 starts processing operation, and performs processing for activating the camera system in Step S01. More specifically, the Bμcom 50 controls the power source circuit 82 to supply power to each circuit comprising this camera system, and further, performs the initial setting of each circuit.

Step S02 is a step to be performed periodically, and also a step for detecting the mounting state of the lens unit 102 by communicating with the Lμcom 20. In Step S03, when detection is made that the lens unit 102 is mounted on the body unit 101, the flow proceeds to Step S06. On the other hand, when detection is made that the lens unit 102 is removed from the body unit 101, the flow proceeds to Step S05 from Step S04, where a control flag F LENS is reset to "0" (F LENS←0), and the flow proceeds to Step S08.

In Step S06, the control flag F LENS is set to "1" (F LENS←1), and the flow proceeds to Step S07. The control flag F LENS is "1" while the lens unit 102 is mounted on the body unit 101 of the camera, and is "0" while the lens unit 102 is removed from the body unit 101.

In Step S07, prior to real manual focus or execution of AF driving, the resonant frequencies (resonant point frequencies) of the transducers 30 and 39 as to an environment state are detected using the current detecting unit 49 and phase-contrast detecting unit 48 of the vibration information detecting unit illustrated in FIG. 9 beforehand. Then, the flow proceeds to Step S08.

In Step S08, the state of the camera operating SW group 79 is detected. Subsequently, when change of the state of the focusing mode switching SW (AF/MF mode switching switch, not shown), which is one of the camera operating SW group 79, is detected, the flow proceeds to Step S16, where manual focus operation is performed. When change of the state of the focusing mode switching SW is not detected, the flow proceeds to Step S10 and the subsequent steps.

In Step S16, the state of the operating-ring amount-of-force setting SW 80 is detected. In Step S17, the value of the control flag F LENS is determined, the flow proceeds to Step S18 when the value is "1", and returns to Step S02 when the value is other than "1".

In Step S18, the flow waits until the operating state (state such that the hand touches the operating ring, or turning force is applied to the operating ring) of the operating ring is detected, then proceeds to Step S19.

In Step S19, the transducer 35 of the ultrasonic actuator 29 is driven according to turning operations for manual focus by the operating ring 7 so as to aid turning operations of the operating ring 7. The flow proceeds to Step S20 according to completion of manual focus driving, and determination is made whether or not the first release SW (not shown) of the camera operating SW group 79 has been operated, and the flow returns to Step S02 when the SW has not been operated. When the SW has been operated, vibration of the transducer is stopped in Step S21, and then the flow proceeds to Step S22, where the luminance information of a subject is acquired from the photometric circuit 65. The exposure period (Tv value) of the CCD unit 55 and the diaphragm setting value (Av value) of the lens 1 are calculated based on the luminance information. Then, the flow proceeds to Step S15 described later.

On the other hand, in the event that the flow proceeds to Step S10, determination is made whether or not the first release SW has been operated. If the first release SW has been operated (ON), the flow proceeds to Step S11, but if the SW has not been operated (OFF), the flow returns to Step S02.

In Step S11, the luminance information of a subject is acquired from the photometric circuit 65. The exposure period (Tv value) of the CCD unit 55 and the diaphragm setting value (Av value) of the lens 1 are calculated based on the luminance information.

Subsequently, in Step S12, the detection data of the AF sensor unit 63 is obtained via the AF sensor driving circuit 62. The amount-of-offset of focus is calculated based on this detection data. In Step S13, the value of the control flag F LENS is determined. If the control flag F LENS is "0", this means that the lens unit 102 is in an unmounted state, so the flow returns to Step S02 without performing the photographing operation in the following Step S14 and the subsequent steps. If the control flag F LENS is "1", the flow proceeds to Step S14.

In Step S14, the amount-of-offset data of focus is transmitted to the L$\mu$com 20 so as to instruct the L$\mu$com 20 to drive the lens 1 based on this amount-of-offset. The ultrasonic actuator 28 drives the lens frame 5 to advance or retreat. Subsequently, the flow proceeds to Step S15.

Following manual focus driving or following AF driving, in either case, the flow proceeds to Step S15, and determination is made whether or not the second release SW (not shown) of the camera operating SW group 79 has been operated. If determination is made that the second release SW has been operated (ON state), the flow proceeds to Step S23, where predetermined photographing operation is performed. If determination is made that the second release SW has not been operated (OFF state), the flow returns to Step S02.

In Step S23 and the subsequent steps, first, the Av value is transmitted to the L$\mu$com 20 so as to instruct the L$\mu$com 20 to drive the diaphragm 8, and the quick return mirror 51 is moved to an up position serving as an evacuation position in Step S24. The front-curtain run of the shutter device 53 is started in Step S25, and execution of image capturing operation is instructed to the image processing controller 73 in Step S26. When exposure to the CCD unit 55 for the period shown in the Tv value is completed, the rear-curtain run of the shutter device 53 is started so as to make the transition to a shutter closed state in Step S27. In Step S28, the quick return mirror 51 is driven to a down position serving as a finder observing position. In parallel with this operation, charging operation of the shutter device 53 is performed.

Subsequently, in Step S29, the B$\mu$com 50 instructs the L$\mu$com 20 to restore the diaphragm 8 to the open position. In Step S30, the B$\mu$com 50 instructs the image processing controller 73 to record the photographed image data in the recording medium 74. When recording of the image data is completed, the flow returns to Step S02.

As described above, according to the camera system 100 according to the present embodiment, in the event that manual focus is performed by manually turning the operating ring 7, when the user selects the operating-ring operating-force auxiliary mode or the operating-ring turning frictional-force reduction mode as necessary, and manually turns the operating ring 7 (including when manually turning operations are not performed), the ultrasonic actuator 29 built in the lens unit 102 is driven or stopped. According to this operation, the amount of turning force of both the operating ring 7 and the distance ring 6 fixed thereto can be adjusted, or the operating ring 7 can be held in a fixed state. Accordingly, the aforementioned manual operations can be adjusted to be heavier or lighter, thereby performing manual focus congenial to the user's taste. Also, photographing may be readily performed without changing the focus position during photographing by fixedly holding the operating ring 7.

Note that the ultrasonic actuators 29 according to the present embodiment, the three ultrasonic actuators 29 are disposed at each 120° on the circumference of the fixing frame 2 as shown in FIG. 11, but not restricted to this, a configuration including the one or two ultrasonic actuators 29 alone may be employed. In the event of employing the one or two ultrasonic actuators 29, bearing balls or rollers for guiding positioning of the thrust direction may be disposed on the positions of the circumference where the other ultrasonic actuators 29 not used in this case are disposed instead of these actuators, thereby providing more a stable holding mechanism.

Also, with the aforementioned embodiment, a mechanism capable of mechanically driving the lens frame 5 has been employed in the operating ring 7, but the gist of the present invention may be applied to a manual focusing system wherein the operating ring 7 is configured so as to turn independently without mechanically interlocking with the lens frame, the amount of turning operation of the operating ring is detected with a scale and position sensor, and the lens frame 5 is driven by an electrical actuator using the output signal thereof as another configuration of the present embodiment. Even in this case, the operating ring 7 may be selectively set according to cases from the case in which rotational load resistance is great at the time of operating the operating ring to the case in which rotational load resistance is small in the same way as with the aforementioned embodiment. Further, with the aforementioned embodiment, the operating ring 7 has been an operating ring for manual focus, but not restricted to this, the same driving device may be applied to an operating ring for zoom driving.

Also, a modification in the amount of operating force of the operating ring 7 may be controlled in such a way that load resistance can be automatically switched by detecting operations of the operating ring 7. For example, an arrangement may be made wherein the operating speed of the operating ring 7 is detected, the vibration conditions of the ultrasonic actuators 29 are electrically modified according to the detected operating speed, thereby allowing the user to operate the operating ring 7 smoothly and comfortably.

Also, with the aforementioned embodiment, the ultrasonic actuators 29 have been described as a configuration coming into contact with the distance ring 6, but different from this, a configuration may be employed wherein the ultrasonic actuators 29 are brought into contact with an interlocking mechanism for manual operations between the operating ring 7 and the external driving ring 3, for example, the external driving ring 3 essentially equivalent to a manual operating member, and even in this case, the same function may be provided.

Further, with the aforementioned embodiment, the frame members for AF and MF (internal driving ring 4 and distance ring 6 illustrated in FIG. 10) have been driven so as to turn by directly coming into contact with the two types of ultrasonic actuators 29 and 28, but instead of this, even with a device having the configuration of at least one frame member subjected to rectilinear movement, so-called linear driving in the optical axial direction, the same function as described in the present embodiment may be achieved by controlling the vibration state thereof so as to bring the frame member into contact with the ultrasonic actuators in the radial direction.

Next, description will be made regarding the configuration and operation of a lens unit for a single lens reflex digital camera system serving as an optical system member (moving member) driving device according to a second embodiment of the present invention with reference to FIGS. 16 through 18.

Figure 16:
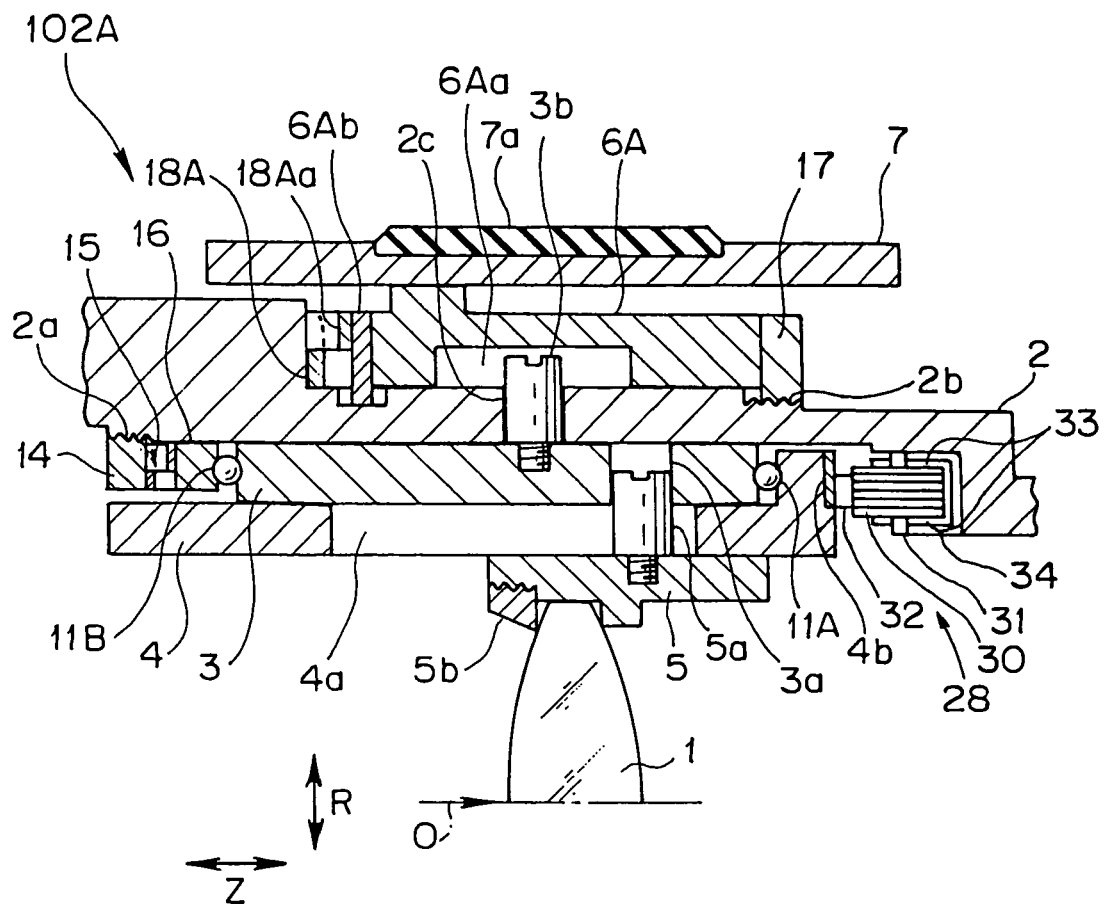
FIG. 16 is a cross-sectional view along the optical axis illustrating the principal components of a lens barrel driving portion of a lens unit according to a second embodiment of the present invention.

FIG. 16 is a cross-sectional view along the optical axis illustrating the principal components of a lens barrel driving portion of a lens unit according to the present embodiment. FIG. 17 is a perspective view of a depressing spring to be applied to the lens unit. FIG. 18 is disassembled perspective view of the principal components of the lens barrel driving portion of the lens unit.

A lens unit (lens barrel) 102A according to the present embodiment illustrated in FIG. 16 is detachably mounted on the body unit 101 as a camera main unit in the same way as the lens unit 102 according to the first embodiment, but does not need particular switching operations of AF (auto focus)/MF (manual focus) in the case of performing manual focus, and can drive the lens frame to be advanced/retreated directly only by simply manually operating the manual operating ring at the time of MF operations. The lens frame is driven to advance or retreat by electric driving of the ultrasonic actuators at the time of AF.

The lens unit 102A according to the present embodiment has a simple configuration and excellent operability as compared with the aforementioned conventional AF/MF switchable lens driving device, a camera system without increasing the amount of rotational operations at the time of MF and without deteriorating AF driving speed can be configured, and also a lens unit (lens barrel), which may be downsized, having a simple mechanism can be provided by employing a simple interlocking mechanical portion for directly conveying the driving turning force of the operating ring to the lens frame side via a frictional spring instead of employing the ultrasonic actuators for setting amount of force as compared with the lens unit 102 according to the first embodiment. Hereinafter, description will be made regarding the different points as to the first embodiment, but components having the same configuration as those according to the first embodiment will be denoted with the same reference numerals.

A body unit capable of mounting this lens unit 102A may be the same as the aforementioned body unit 101. However, as for the Bµcom 50 (FIG. 1) to be built in the body unit, the vibrator control means for the ultrasonic actuators 29, the switching control means for switching the operating ring 7 to a fixed state or to an operable unfixed state, the amount-of-force adjusting means for adjusting the manual operating force of the operating ring 7, the amount-of-operating-force setting SW 80, and the AF/MF mode switching switch within the camera operating SW group 79 are not always indispensable. With the present embodiment, description will be made on condition that the AF/MF mode switching switch is not mounted.

With the lens unit 102A, as for the Lµcom 20 (FIG. 1) to be built in, the vibrator control means for the ultrasonic actuators 29, the switching control means for switching the operating ring 7 to a fixed state or to an operable unfixed state, and the amount-of-force adjusting means for adjusting the manual operating force of the operating ring 7 are not necessary. Further, let us say that the ultrasonic actuators 29, the transducer driving circuit 24 for driving the actuator, the position sensor 26 for detecting turning of the operating ring 7, and the scale 26a, which are built in the lens unit 102, are not provided.

The mechanical portion of the lens unit 102A, as illustrated in FIG. 16, comprises the fixing frame 2 having the circumferential groove 2c along the perimeter direction as with the lens unit 102, the external driving ring (manual driving ring and first driving conveying mechanism) 3, which is fitted in the fixing frame 2, having the slant cam groove 3a and the driving pin (manual lens displacement means) 3b serving as a cam follower, the internal driving ring (electric driving ring, electric moving member, and second driving conveying mechanism) 4, which is fitted in the external driving ring 3, driven to turn by the ultrasonic actuators 28 serving as electrical driving sources, and has the rectilinear guide groove 4a, the lens frame 5, which is fitted in the internal driving ring 4, and holds the lens 1 serving as part of the photographing lens, and also is firmly fixed with the driven pin (second connecting mechanism and electric lens displacement means) 5a serving as a cam follower, the operating ring 7, which can be manually turned, on the lens unit perimeter portion, the distance ring (manual operating member) 6A, which is firmly fixed to the inner circumference of the operating ring 7 as a mechanical portion different from the lens unit 102, and is fitted in the outer circumference of the fixing frame 2 so as to turn, and the depressing spring (amount-of-operating-force adjusting mechanism and load means) 18A pressing against the distance ring 6A in the optical axial direction via a frictional plate 6Ab.

The distance ring 6A includes a rectilinear guide groove 6Aa along the optical axial O direction. The rear end face of the distance ring 6A is brought into contact with a thrust ring (amount-of-operating-force adjusting mechanism) 17 screwed with a screw portion 2b of the fixing frame 2 and fixed. The frictional plate 6Ab subjected to the pressing force of the depressing spring 18A is brought into contact with the front end face of the distance ring 6A.

Note that the driving pin 3b of the external driving ring 3 slidably passes through the circumferential groove 2c of the fixing frame 2, and is slidably fitted in the rectilinear guide groove (manual lens displacement mechanism) 6Aa of the distance ring 6A. The driven pin 5a of the lens frame 5 slidably passes through the rectilinear guide groove (electric lens displacement mechanism) 4a of the internal driving ring 4, and is slidably fitted in the cam groove (manual lens displacement mechanism and electric lens displacement mechanism) 3a of the external driving ring 3.

The frictional plate 6Ab is a ring-shaped plate member, prevented from turning around the fixing frame 2, and also mounted on the fixing frame 2 in a movable state in the optical axial O direction.

Figure 17:
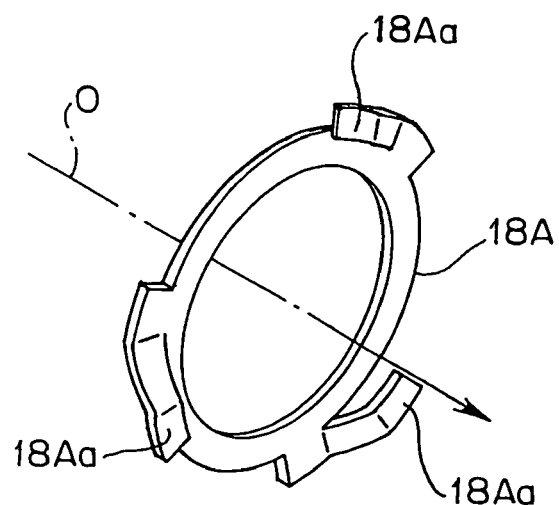
FIG. 17 is a perspective view of a depressing spring to be applied to the lens unit in FIG. 16.

The depressing spring 18A is a ring-shaped metal plate member as illustrated in FIG. 17, and has three lingulate spring deforming contact portions 18Aa on the outer circumference thereof. The spring deforming contact portions 18Aa can be elastically deformed in the optical axial O direction. The depressing spring 18A is brought into contact with the step portion of the fixing frame 2, and fitted in, and the spring deforming contact portions 18Aa is brought into contact with the frictional plate 6Ab. Thus, the distance ring 6A is subjected to the frictional force of the frictional plate 6Ab and supported with appropriate turning frictional load by the fixing frame 2 by the spring deforming contact portions 18Aa coming into contact with the frictional plate 6Ab, thereby allowing the user to operate the operating ring 7 with appropriate turning operating force. At the same time, turning of the distance ring 6A due to turning operation of the internal driving ring 4 driven by the ultrasonic actuators 28 at the time of AF operation is restricted, thereby executing normal AF operation.

The pressing force in the optical axial O direction as to the distance ring 6A of the frictional plate 6Ab is adjustable by replacing the depressing spring 18A, or by adjusting the screw-in position as to the screw portion 2b of the fixing frame 2 of the thrust ring 17, or by inserting a spacer. As for the depressing spring 18A, a waved washer or conical spring may be employed.

Also, the configuration of the ultrasonic actuators 28 driven at the time of AF operation and the driving control thereof are the same as those in the first embodiment.

Note that with the AF/MF operation in the lens unit 102A, the AF/MF mode switching switch is not provided on the camera body side as described above, so the processing in Step S09 in the photographing sequence flowchart in FIG. 14 is skipped, and state detection of the first release SW in Step S10 is performed. Following detection being made that the first release SW has been operated, turning operations of the operating ring 7 are not necessary, so in the event that normal AF operation can be performed, photographing in the AF mode is performed without extra operations. However, let us say that in the event that the user operates the operating ring 7, and drives the lens 1 serving as a focus lens to advance or retreat by force, photographing is performed at the advanced or retreated position of the lens 1 determined by the operations of the operating ring 7.

Next, description will be made regarding the moving state of each frame member at the time of AF/MF operation in the lens unit 102A according to the present embodiment thus configured with reference to FIGS. 14, 18, 19A through 19C.

Figure 18:
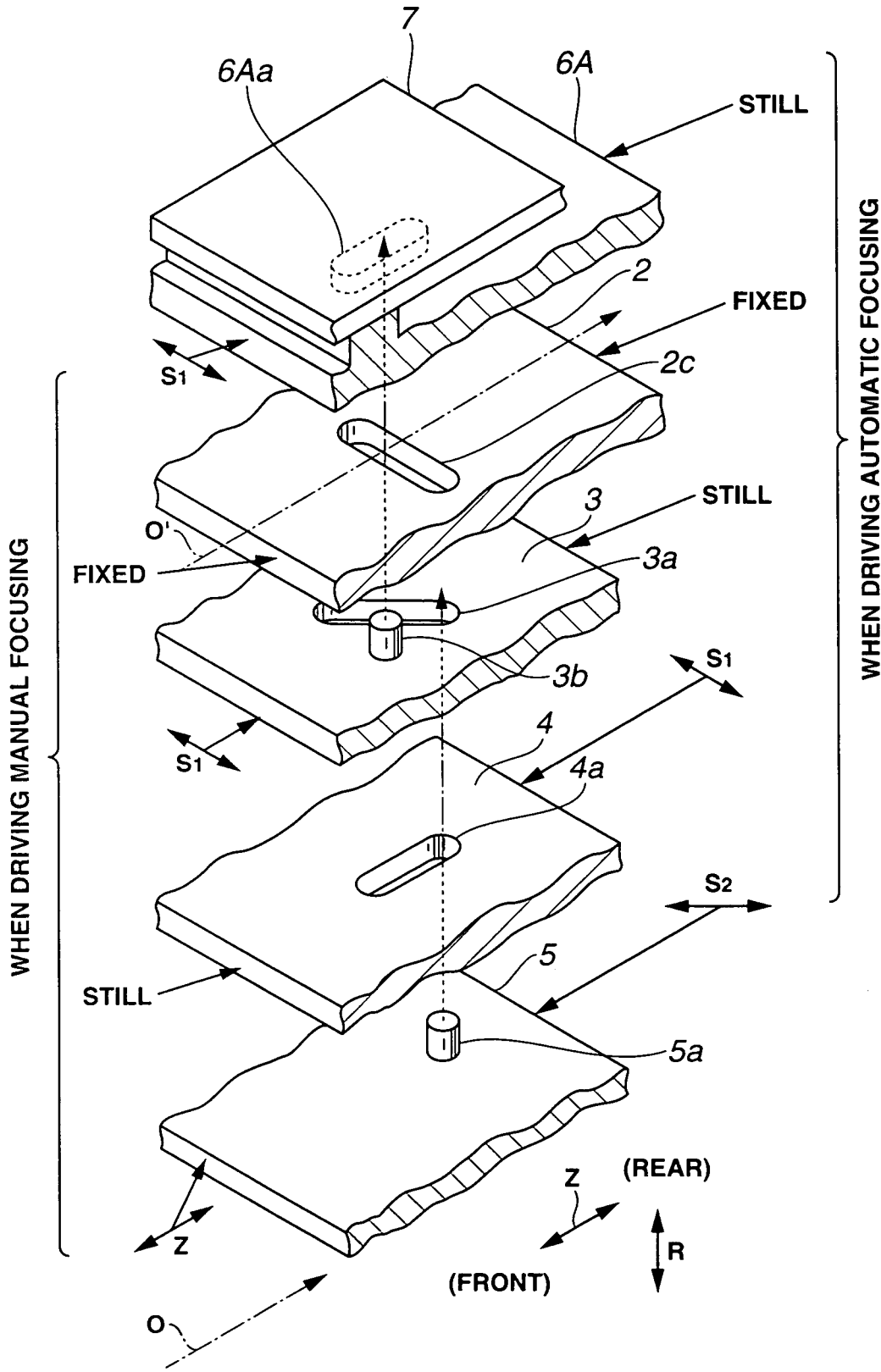
FIG. 18 is disassembled perspective view of the principal components of the lens barrel driving portion of the lens unit in FIG. 16.

FIGS. 19A, 19B, and 19C are partial developments of the principal components (guide groove, driving/driven pins, and so forth) of the lens barrel driving portion in FIG. 18 as viewed from the perimeter side, FIG. 19A illustrates the initial state of focusing driving, FIG. 19B illustrates a manual focusing driving state, and FIG. 19C is an electric focusing driving state.

Let us say that the ultrasonic actuators 28 are stopped at the time of the MF mode (manual focusing), the internal driving ring 4 is in a stationary state, and the distance ring 6A, the external and internal driving rings 3 and 4, and the lens frame 5 are at the initial positions (FIG. 18 and FIG. 19A). Upon the user manually turning the operating ring 7 around the optical axis O (S1), the external driving ring 3 is driven to turn around the optical axis O via the driving pin 3b in the same way. The driven pin 5a is driven to move in the optical axial O direction along the rectilinear guide groove of the internal driving ring 4, which is in a stationary state, by the slant cam groove 3a in accordance with turning of the external driving ring 3. Accordingly, the lens frame 5 is driven out to the desired focusing position (FIG. 19B).

At the time of the AF mode (electric focusing), the operating ring 7, the distance ring 6A, and the external driving ring 3 are at a standstill, and the external and internal driving rings 3 and 4, and the lens frame 5 are at the initial positions (FIG. 18 and FIG. 19A). Upon the ultrasonic actuators 28 being driven, and the internal driving ring 4 being turned around the optical axis O (S1), the driven pin 5a slides in the slant direction (S2) along the cam groove 3a of the external driving ring 3 slanting while being guided by the rectilinear guide groove 4a of the internal driving ring 4. Accordingly, the lens frame 5 is moved in the optical axial O direction while rotating around the optical axis O, and is driven out to the AF focusing position (FIG. 19C).

Note that with the second embodiment, a configuration wherein the position sensor 26 for detecting tuning of the operating ring 7 and the scale 26a are not provided has been employed, but a configuration wherein the position sensor 26 and the scale 26a are provided as MF operating detecting means may be proposed as a modification thereof.

With this modification, in the event that operations of the operating ring 7 is detected by the position sensor 26, immediately following which the photographing mode of the camera is switched to the MF mode automatically. Accordingly, the following operations of the operating ring 7, the camera enters a waiting state of the first or second release switch without returning to the AF mode. Following photographing, or following a predetermined period, the photographing mode is returned to the AF mode.

According to the lens unit 102A of the present embodiment, a camera system without increasing the amount of rotational operations at the time of MF and without deteriorating AF driving speed can be configured, and also a lens unit (lens barrel), which may be downsized, having a simple mechanism can be provided by employing a simple interlocking mechanical portion for directly conveying the driving turning force of the operating ring to the lens frame side.

The essence of the present invention may be applied to a camera system for switching electric zoom and manual zoom regardless of switching of focusing operation such as AF/MF according to the aforementioned embodiments. Further, while the aforementioned embodiments have been described as being applied to a digital camera system, the same configurations may be applied to an optical member driving device in a silver-salt camera system.

Further, the essence of the present invention may be applied to a moving member driving device for moving a moving member other than an optical member by switching a manual operating member and an electric member.

Thus, the amount of operating force of the moving member can be set in a wide range including the light force. Also, the driving device according to the present invention may be employed as a driving device capable of fixedly holding the operating member on a predetermined position, or as a driving device of an optical member or other moving members.

The present invention is not restricted to the aforementioned embodiments, other than those, various modifications can be made without departing from the spirit and scope of the invention at an execution stage. Further, inventions of various types of stages are encompassed in the aforementioned embodiments, and various types of inventions may be extracted by appropriately combining multiple configuration requirements to be disclosed.

For example, even if some configuration requirements are eliminated from all of the configuration requirements shown in each embodiment, the configuration excluding these eliminated configuration requirements may be extracted as the present invention, so long as the features of the present invention described in SUMMARY OF THE INVENTION are realized.

What is claimed is:

1. A driving device for a movable member, which has an ultrasonic actuator, for controlling movement of the movable member, the device comprising:
   a manual operating member for moving the movable member according to manual operations;
   a vibrator, which is a member comprising the ultrasonic actuator, being pressured to add frictional contact force to the manual operating member; and
   an amount-of-operating-force adjusting controller for arbitrarily adjusting an amount of manual operating force at a time of performing manual operations of the manual operating member by controlling a state of vibration generated by the vibrator to change the frictional contact force over a range extending between a small turning frictional force and a large turning frictional force.

2. The driving device according to claim 1, wherein the amount-of-operating-force adjusting control means drives and controls the vibrator to change and set at least vibration amplitude in the pressing direction.

3. The driving device according to claim 1, wherein the amount-of-operating-force adjusting controller drives and controls the vibrator to generate force for positively aiding operations in the operating direction of the manual operation member and not merely reduce a frictional force applied to the manual operating member provided by the vibrator.

4. The driving device according to claim 1, wherein the movable member is an optical member.

5. A driving device, for a movable member, which has an ultrasonic actuator, for controlling movement of the movable member, the device comprising:
   a manual operating member manually operated to move the movable member;
   a vibrator, which is a member comprising the ultrasonic actuator, brought into pressurizing contact with the manual operating member to change the frictional contact force to the manual operating member;
   a vibrator controller for driving and controlling the vibrator to change the frictional contact force relating to an amount of manual operating force at a time of performing manual operations of the manual operating member; and
   an amount-of-operating-force switch-and-setting member for setting driving control of the vibrator with the vibrator controller to switch and set the amount of operating force of the manual operating member to any amount within a given range.

6. An optical driving device, which has an ultrasonic actuator, for controlling movement of an optical member, the driving device comprising:
   an operating member, which can be manually operated, to interlock and move the optical member;
   a vibrator, which is a member comprising the ultrasonic actuator, for generating ultrasonic vibration;
   pressurizing device for pressurizing the vibrator so that the vibrator is brought into frictional contact with the operating member;
   vibrator control for performing driving control of the vibrator to change a vibration state of the vibrator so as to arbitrarily change a frictional contact force to any frictional contact force within a given range, which brings the vibrator into frictional contact with the operating member, relating to an amount of manual operating force at the time of manually operating the operating member.

7. The optical member driving device according to claim 6, wherein the vibrator controller controls the vibrator to make a transition to a non-active state when the operating member is not manually operated to fix and hold the operating member with frictional contact force, and control the vibrator to make a transition to a driving state when detection is made that the operating member is started to be operated manually to move the operating member by reducing frictional contact force.

8. A driving device for a movable member, which movable member has at least part of an optical member of an optical system for forming an optical image of a subject, for controlling movement of the movable member to be moved in an optical axial direction, the device comprising:
   an operating member configured to be operated manually;
   a driving mechanism for moving the movable member according to operations of the operating member;
   an amount-of-operating-force setting device for outputting a signal according to setting operations to arbitrarily set an amount of operating force of the operating member to any operating force within a given range; and
   an amount-of-force adjusting controller for controlling the amount of operating force of the operating member according to a setting signal from the amount-of-force setting device.

9. The driving device according to claim 8, wherein the amount-of-force adjusting controller has a transducer which is brought into pressured frictional contact with the operating member, and drives and controls at least the vibration amplitude of the transducer in the pressured direction so as to be changed.

10. The driving device according to claim 9, wherein the amount-of-force adjusting controller generates force for aiding operations of the operating member in an operating direction.

11. A driving device for a movable member, which has an ultrasonic actuator, for controlling movement of the movable member, the device comprising:
   a manual operating member for moving the movable member according to manual operations;
   a vibrator, which is a member comprising the ultrasonic actuator, being pressured to add frictional contact force to the manual operating member;
   a scale provided along the manual operating member;
   a position sensor arranged at a fixed position opposite said scale for generating an output responsive to movement of the manual operating member and hence said scale;

a controller responsive to the output of said sensor for controlling a state of vibration generated by the vibrator to aid a manual force applied to move the manual operating member.

12. The driving device according to claim 11, wherein the ultrasonic actuator is configured to apply elliptical vibration to said manual operating member in a direction which aids the manual force applied to move the manual operating member.

13. A driving device for a movable member, which has an ultrasonic actuator, for controlling movement of the movable member, the device comprising:
- a manual operating member for moving the movable member according to manual operations;
- a vibrator, which is a member comprising the ultrasonic actuator having a given resonant operating frequency and being pressured to add frictional contact force to the manual operating member; and
- an amount-of-operating-force adjusting controller for arbitrarily adjusting an amount of manual operating force at a time of performing manual operations of the manual operating member by providing a driving signal having a frequency which is shifted from said resonant frequency.

14. A driving device for a movable member, which has an ultrasonic actuator, for controlling movement of the movable member, the device comprising:
- a manual operating member for moving the movable member according to manual operations;
- a vibrator, which is a member comprising the ultrasonic actuator, and being pressured to add frictional contact force to the manual operating member; and
- an amount-of-operating-force adjusting controller for arbitrarily adjusting an amount of manual operating force of the manual operating member by providing a burst driving signal to change a period for vibration of said ultrasonic actuator.

15. The driving device according to claim 1, wherein the frictional contact force added to the manual operating member comprises:
- a depressing spring.

16. The driving device according to claim 15, wherein the depressing spring is one of a metallic plate having at least one lingulate spring deforming contact portion; a waved washer and a conical spring.

17. The driving device according to claim 1, wherein the frictional contact force added to the manual operating member comprises:
- a depressing spring; and
- one of a washer and an adjustable thrust member for adjusting a force applied to the manual operating member by said depressing spring.

* * * * *